United States Patent [19]

Tanaka et al.

[11] Patent Number: 5,709,037
[45] Date of Patent: Jan. 20, 1998

[54] STREAM DRYING PROCESS

[75] Inventors: Hiroshi Tanaka; Nobuaki Doi; Masashi Omori; Hiroaki Ishikawa, all of Hyogo, Japan

[73] Assignees: Mitsubishi Denki Kabushiki Kaisha, Tokyo; Ryoden Semiconductor System Engineering Corporation, Hyogo, both of Japan

[21] Appl. No.: 726,734

[22] Filed: Oct. 7, 1996

Related U.S. Application Data

[62] Division of Ser. No. 526,478, Sep. 11, 1995, Pat. No. 5,608,974.

[30] Foreign Application Priority Data

Nov. 7, 1994 [JP] Japan ................... 6-272102
Jan. 12, 1995 [JP] Japan ................... 7-003247

[51] Int. Cl.⁶ .................................................. F26B 3/00
[52] U.S. Cl. ......................... 34/330; 34/381; 34/434; 34/470
[58] Field of Search ..................... 34/329, 330, 381, 34/389, 405, 415, 426, 434, 469, 470, 510; 134/902; 118/61, 68, 69

[56] References Cited

U.S. PATENT DOCUMENTS

| | | | |
|---|---|---|---|
| 4,777,970 | 10/1988 | Kusuhara | 34/78 |
| 5,273,589 | 12/1993 | Griswold et al. | 134/21 |
| 5,331,987 | 7/1994 | Hayashi et al. | 134/102.1 |
| 5,369,891 | 12/1994 | Kamikawa | 34/78 |
| 5,371,950 | 12/1994 | Schumacher | 34/78 |
| 5,443,540 | 8/1995 | Kamikawa | 34/78 X |
| 5,535,525 | 7/1996 | Gardner | 34/78 |
| 5,539,995 | 7/1996 | Bran | 34/470 X |
| 5,575,079 | 11/1996 | Yokomizo et al. | 34/470 X |

Primary Examiner—Henry A. Bennett
Assistant Examiner—Steve Gravini
Attorney, Agent, or Firm—Lowe, Price, LeBlanc & Becker

[57] ABSTRACT

A material to be dried, such as a semiconductor substrate during manufacturing a semiconductor device, is loaded into a process chamber fitted at a loading opening with a lid which is closed from above. The inner side wall surface of the process chamber has a first surface formed in the lower part thereof and is substantially in parallel with the inner wall surface of the lid, and a second surface extending from the upper end part of the first surface and bent outwards to face the inner wall surface of the lid. A processing solution vapor is fed through a steam supply port in the second surface into the process chamber and flowed downwardly over the material to be dried. The processing solution vapor is condensed and recovered below the material to be dried.

5 Claims, 30 Drawing Sheets

STREAM DRYING PROCESS

This application is a division of application Ser. No. 08/526,478 filed Sep. 11, 1995, U.S. Pat. No. 5,608,974.

BACKGROUND OF THE INVENTION

1. Field of the Invention

The present invention relates generally to a steam drying apparatus and, more particularly, to a steam drying apparatus for drying a material to be dried, by exposing the material to a vapor of a processing solution. The present invention also relates to a cleaning apparatus incorporating such a steam drying apparatus. And further the present invention relates to a steam drying process for drying the material to be dried, by exposing the material to the processing solution vapor.

2. Description of the Related Art

A process for manufacturing semiconductor devices includes a step for processing semiconductor substrates with a chemical, then a step for washing them with water, and further a step for drying them.

FIG. 24 is a schematic view of a prior art steam drying apparatus. A steam drying apparatus 100 has a process chamber 101. Above this process chamber 101 is provided a shutter 109 through which a semiconductor substrate wafer 200 comes in and out. Also above the process chamber 101 is provided an exhaust port 330a for discharging a gas out of the process chamber. The process chamber 101 is provided at the bottom with a heating coil 105 through which a water vapor 310 passes. At the bottom of the process chamber 101 is held a processing solution (e.g., isopropyl alcohol IPA) 301. The water vapor 310 gives heat to the processing solution when passing through the heating coil 105, turning itself to a drain 311 to be discharged from the heating coil 105. A cooling coil 106 in which the cooling water 320 flows through is installed on the inside wall surface of the process chamber 101 below the exhaust port 330 located in the upper part of the process chamber 101. In the process chamber 101 is provided an inner tank 102. To the bottom of the inner tank 102 is connected the drain pipe 103. The semiconductor substrate wafer 200 held in the wafer cassette 201 is carried into the inner tank 102 by means of an elevator 108.

Next, operation of the steam drying apparatus will be explained.

A raw processing solution 300 is supplied from a raw solution supply pipe 104 to the bottom section of the process chamber 101 while discharging a gas out of the process chamber 101 through the exhaust port 330. Thus a predetermined quantity of processing solution 301 is reserved at the bottom section of the process chamber 101. The water vapor 310 is supplied into the heating coil 105 and the cooling water 320 is fed to the cooling coil 106. Preparations are completed when the processing solution 301 has reached a predetermined temperature. At this time, the process chamber 101 is filled with a processing solution vapor 302 that has evaporated according to the temperature of the processing solution 301. The processing solution vapor 302 is reduced to liquid by the cooling coil 106, passing along a condensate recovery gutter 107 and then back to the bottom section of the process chamber 101. A vapor line (a vapor-liquid boundary) 302a is formed from the lower part of the cooling coil 106 towards the center, and therefore the processing solution vapor 302 is hard to go outside at the upper part of the vapor line 302a.

Next explained is a procedure for drying process. The shutter 109 is opened. The semiconductor substrate wafer 200 set in the wafer cassette 201 is loaded on the elevator 108. The shutter 109 is closed, and the elevator 108 is lowered to a predetermined position, from which the semiconductor substrate wafer 200 is placed in the inner tank 102. An increased quantity of water vapor 310 is supplied to the heating coil 105, to rapidly heat the processing solution 301, thereby producing a large volume of processing solution vapor 302. The processing solution vapor 302 reaches the semiconductor substrate wafer 200 in the inner tank 102 as illustrated. When the semiconductor substrate wafer 200 is at a normal temperature, the processing solution vapor 302 condenses on the surface of the semiconductor substrate wafer 200. The condensate of the processing solution 304 is substituted by a wet component present on the surface of the semiconductor substrate wafer 200, flowing together with the wet component downwards with a gravity. With the continuance of condensation of the processing solution vapor 302, the temperature of the semiconductor substrate wafer 200 keeps on rising, gradually ceasing the condensation and accordingly beginning to dry the surface of the semiconductor substrate wafer 200. During this period, a used processing solution 305 inclusive of the wet component flows from the inner tank 102 through a drain pipe 103, being discharged outside. The vapor line 302a at this time is formed at a higher position than that in the step of preparations. After the surface of the semiconductor substrate wafter 200 has become nearly dry, the elevator 108 is raised. The shutter 109 is opened, and the semiconductor substrate wafer 200 is taken out of the wafer cassette 201, thus completing the drying process.

When the drying process is carried out in the semiconductor substrate wafer cleaning process, the wet component is ultrapure water, and the processing solution is generally IPA (isopropyl alcohol). Recently, there has been developed a processing solution substituting for the IPA, and there is the possibility that, in a similar manner, drying processes for various applications will be realized.

The prior art steam drying apparatus, being constituted as described above, has the following various problems.

First, in the process in which the semiconductor substrate wafer 200 is lowered as low as the level for drying process as shown in FIG. 24, the process chamber 101 and the inner tank 102 are already full of the processing solution vapor 302, therefore there exists the problem that since vapor condensation on the surface of the semiconductor substrate wafer 200 advances upwards from below, foreign substances are likely to remain at a high percentage on the surface of the semiconductor substrate wafer 200.

Furthermore, at the time of the process the quantity of the water vapor 310 to be supplied to the heating coil 105 is increased for rapid heating of the processing solution 301, to thereby generate a large volume of processing solution vapor 302. The temperature of the processing solution vapor 302, therefore, becomes considerably high above the boiling point, resulting in a deteriorated efficiency of condensation on the surface of the material to be dried.

Furthermore there is such a problem that since the vapor 302 of the processing solution condensed by the cooling coil 106 and recovered returns to the bottom section of the process chamber 101, the thus recovered condensate is repetitively recirculated for reuse as the processing solution 301, resulting in deteriorated processing solution 301 due to the mixing and accumulation of the wet component from the surface of the semiconductor substrate.

Furthermore, there is such a problem that with the generation of the processing solution vapor 302, there occurs much of mists having, as a nucleus, impurities already included in the raw processing solution, resulting in a deteriorated characteristic of the semiconductor substrate wafer 200 due to the impurities holding on its surface.

Furthermore, there is such a problem that since the cooling coil 106 is not enough to recover the processing solution vapor 302, and, as illustrated, one-third of a consumption of the processing solution goes out as the exhaust 330 through the exhaust port 330a, the consumption of the processing solution increases.

Furthermore, there is such a problem that since the cooling coil 106 is located in a high position inside the process chamber 101, a special elevator 108 is required to lower the semiconductor substrate wafer 200 to the processing level, and accordingly the apparatus will become very large in size.

Furthermore, the wet component holding on the surface of the semiconductor substrate wafer 200 enters the processing solution 301, accumulating to deteriorate the processing solution. Therefore, the process chamber, being in most cases made of a high-cost material such as quartz for the purpose of preventing corrosion by acid and alkali components in the wet component, is likely to be broken and moreover spare parts also are expensive.

Furthermore, because the air is included in the processing solution vapor 302 in the process chamber 101, there is a very serious danger of explosion when a flammable chemical such as IPA is used as the processing solution 301.

SUMMARY OF THE INVENTION

It is therefore an object of the present invention to provide a steam drying apparatus improved to remove all foreign substances from the surface of a material to be dried.

It is another object of the present invention to provide a steam drying apparatus improved to prevent foreign substances from holding on the surface of the material to be dried.

Another object of the present invention is to provide a steam drying apparatus improved to achieve improved processing performance.

Another object of the present invention is to provide a steam drying apparatus improved to decrease the consumption of the processing solution.

Another object of the present invention is to provide a steam drying apparatus improved to enable miniaturization.

Another object of the present invention is to provide a low-cost steam drying apparatus.

Another object of the present invention is to provide a steam drying apparatus improved for higher safety.

Another object of the present invention is to provide a cleaning apparatus incorporating the steam drying apparatus having the above-described features.

Another object of the present invention is to provide a steam drying process improved to remove all foreign substances from the surface of the material to be dried.

Another object of the present invention is to provide a steam drying process improved to reduce the consumption of the processing solution.

Another object of the present invention is to provide a steam drying process capable of drying at a low cost.

Another object of the present invention is to provide a steam drying process improved to attain higher safety.

The steam drying apparatus according to a first aspect of the present invention pertains to an apparatus for drying a material to be dried, by exposing the material to a processing solution vapor. The drying apparatus has in the upper end an unloading opening for taking in and out the material to be dried, and a process chamber for holding the material to be dried. The unloading opening of the process chamber is provided with a lid, with which the process chamber is hermetically closed from above. The inside wall surface of the process chamber consists of a first surface which is substantially parallel with the direction of gravity formed in the lower portion and a second surface which extends from the top end portion of the first surface and is so bent outwardly as to face the inside wall surface of the lid. The second surface has a steam supply port for supplying the processing solution vapor into the process chamber. To the steam supply port is connected a steam supply means for supplying the processing solution vapor into the process chamber.

The cleaning apparatus according to a second aspect of the present invention is provided with a loader/unloader chamber for loading and unloading the semiconductor substrate. Adjacently to the loader/unloader chamber is provided a water washing tank for rinsing the semiconductor substrate. Provided adjacently to the water washing tank is a steam drying means for drying the semiconductor substrate by exposing the substrate to the processing solution vapor. The steam drying means has in the upper end an unloading opening for taking in and out the semiconductor substrate, and a process chamber for holding the semiconductor substrate wafer. The unloading opening of the process chamber is closed from above with a lid which is provided for hermetically closing the process chamber. The inside wall surface of the process chamber consists of a first surface which is substantially in parallel with the direction of gravity formed in the lower portion and a second surface which extends from the top end portion of the first surface and is so bent outwardly as to face the inside wall surface of the lid. The second surface has a steam supply port for supplying the processing solution vapor into the process chamber. To the steam supply port is connected a steam supply means for supplying the processing solution vapor into the process chamber.

The steam drying process according to a third aspect of the present invention pertains to a process for drying the material to be dried, by exposing the material to the processing solution vapor. First the material to be dried is set in the process chamber. The processing solution vapor is supplied downwards from the upper part of the material to be dried, thus drying the material to be dried. Below the material to be dried, the processing solution vapor that has come into the process chamber is condensed and recovered.

The steam drying apparatus according to a fourth aspect of the present invention is for drying the material to be dried, by exposing the material to the processing solution vapor. This apparatus is equipped with a process chamber for holding the material to be dried. In the upper part of the process chamber is provided a steam supply port for supplying the processing solution vapor into the process chamber. Within the process chamber a supporting means for supporting the material to be dried is provided. At the bottom of the process chamber is provided a cooling means for cooling to condense the processing solution vapor that has come through the process chamber. Between the supporting means and the cooling means there is provided a means for preventing the processing solution vapor that has hit on the cooling means, from rising towards the material being dried.

According to the steam drying apparatus in the first aspect of the present invention, as there is provided the steam supply port in the second surface bent to face the inside wall surface of the lid, the processing solution vapor that has entered the process chamber through the steam supply port flows along the inside wall surface of the lid, then being forced to flow downwards from above the material being dried.

According to the cleaning apparatus in the second aspect of the present invention, as the steam drying apparatus having the aforementioned features is incorporated in the drying process, it is possible to prevent foreign substances from remaining, and impurities from holding, on the surface of the material being dried. Also as the positions of the semiconductor substrate in the steam drying apparatus, the chemical tank and the water washing tank can be set to the same level, it is possible to transfer the semiconductor substrate by the use of a transfer robot.

According to the steam drying process in the third aspect of the present invention, the stream of the processing solution vapor is forced downwards; therefore the condensate moves downwards on the surface of the material being dried, lessening the probability that foreign matters will remain on the surface of the material being dried. Furthermore, since the processing solution vapor is condensed for reuse, the consumption of the processing solution can be decreased.

According to the steam drying apparatus in the fourth aspect of the present invention, since there is provided a means for preventing the processing solution vapor that has hit against the cooling means, from rising between the supporting means and the cooling means towards the material being dried, the processing solution vapor that has hit upon the cooling means will not rise and accordingly will not contaminate the material being dried.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Hereinafter preferred embodiments of the present invention will be explained with reference to the accompanying drawings.

Embodiment 1

Figure 1:
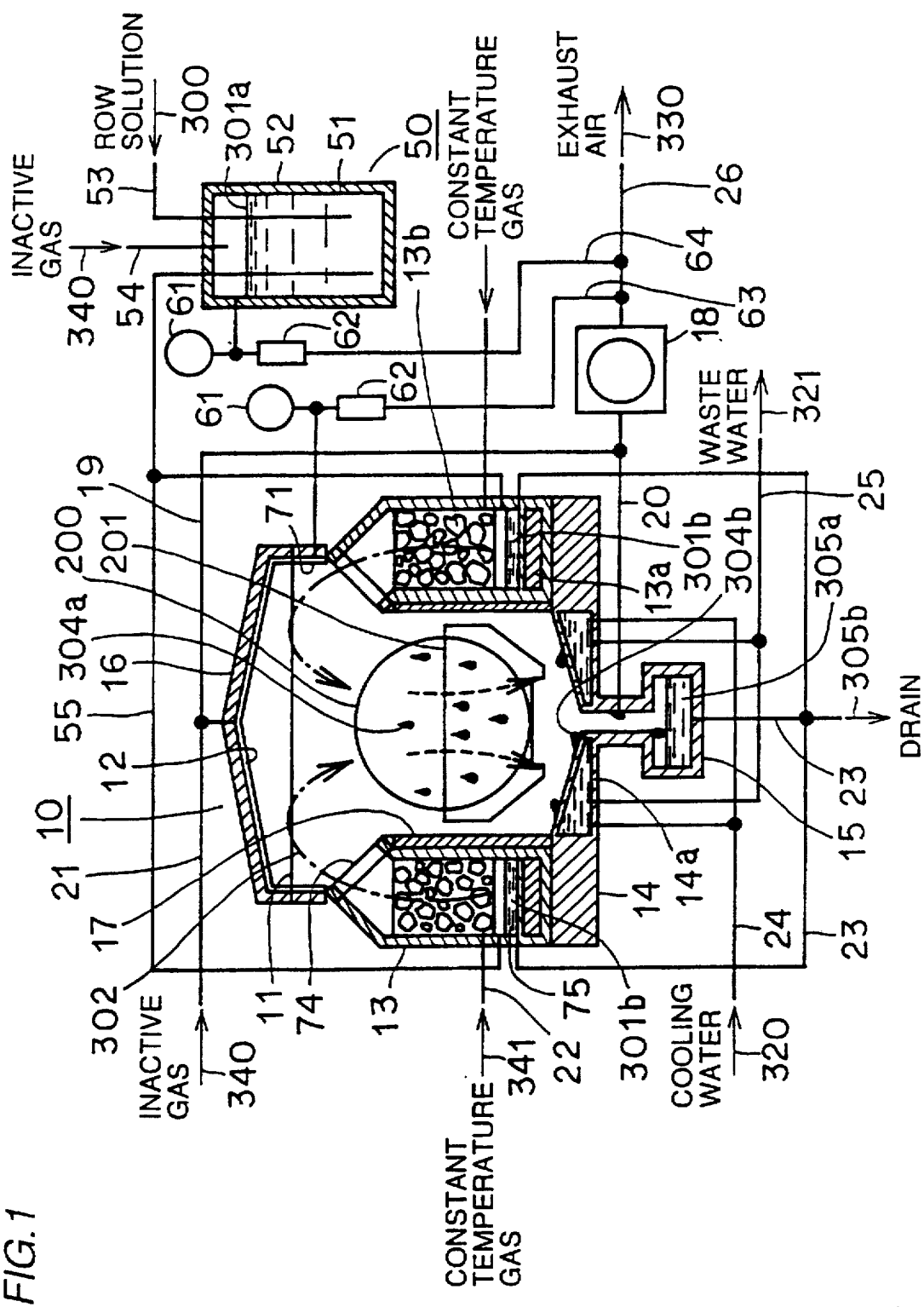
FIG. 1 is a schematic view of a steam drying apparatus of an embodiment 1 according to the present invention.
Figure 2:
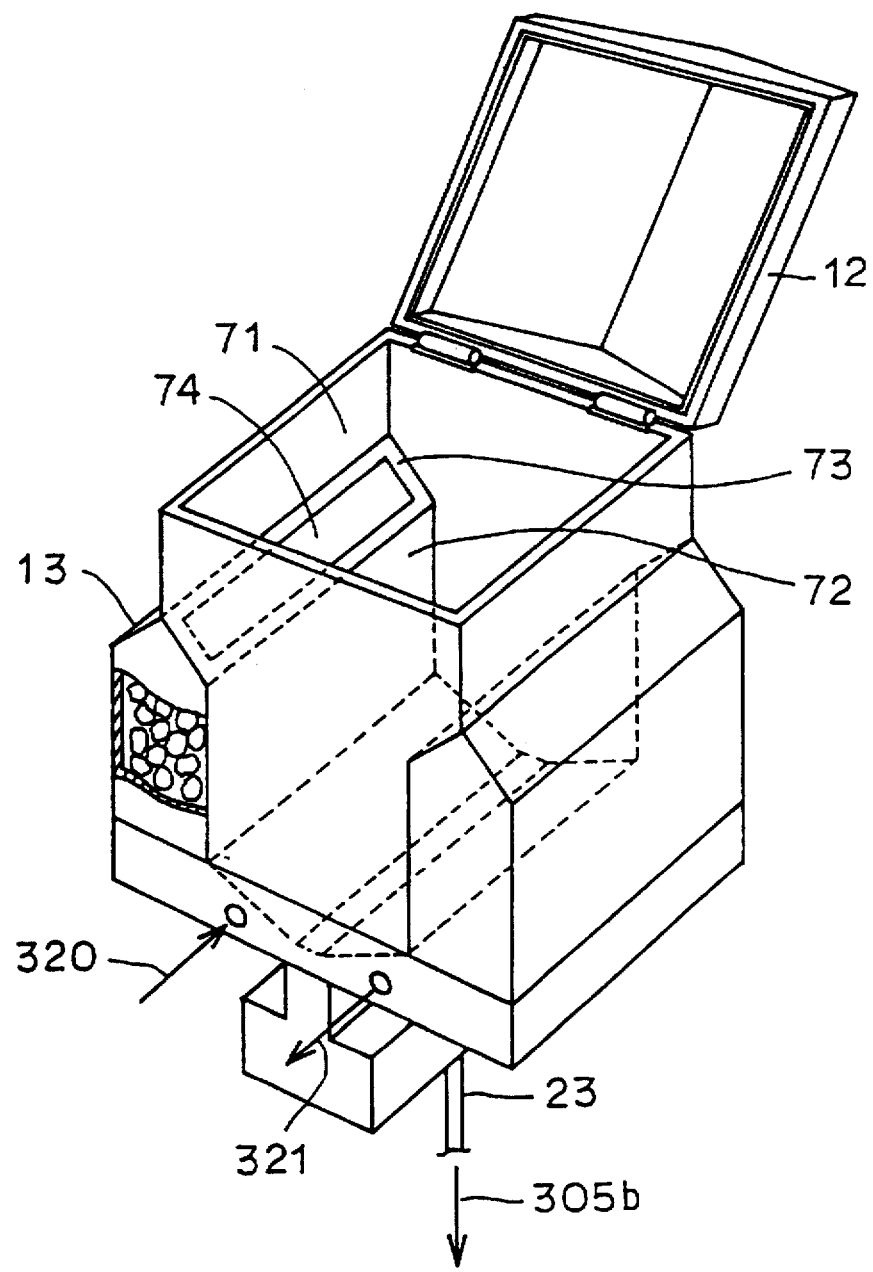
FIG. 2 is a perspective view of the steam drying apparatus of the embodiment 1.

FIG. 1 is a schematic view of a steam drying apparatus according to an embodiment 1, and FIG. 2 is a perspective view thereof.

The steam drying apparatus according to the embodiment is designed for use in drying a semiconductor substrate wafer 200 which is a material to be dried, by exposing the wafer 200 to a processing solution vapor 302. The steam drying apparatus has in its upper end an unloading opening 71 for taking in and out the semiconductor substrate wafer 200, and a process chamber for holding the semiconductor substrate wafer 200. The unloading opening 71 of the process chamber is fitted with a lid 12 for hermetically closing the process chamber 11.

The inside wall surface of the process chamber 11 has a first surface 72 which is formed in its lower part and is substantially in parallel with the direction of gravity, and a second surface 73 extending from the upper end portion of the first surface 72 and bent outwards to face the inside wall surface of the lid 12. The second surface 73 is provided with a steam supply port 74 for feeding the processing solution Vapor 302 into the process chamber 11. To this steam supply port 74 is connected the steam supply means 13 for supplying the processing solution vapor 302 into the process chamber 11. At the bottom surface of the process chamber 11 is provided a cooler 14a for cooling to condense the processing solution vapor 302 that has passed through the process chamber 11. At the bottom of the process chamber 11 is connected a recovery tank 15 for recovering the used processing solution 305a that has been changed to a liquid by the cooler 14a. Hereinafter the cooler 14a and the recovery tank 15 will be included in a steam recovery means 14.

The steam supply means 13 has a processing solution reservoir 75 for temporarily holding the processing solution 301b before changing to the processing solution vapor 302. Below the processing solution vapor reservoir 75 is provided a heater 13a for heating to change the processing-solution 301b held in the processing solution reservoir 75 into the processing solution vapor 302. Between the processing solution reservoir 75 and the steam supply port 74 there is provided a porous or mesh-like member 13b for trapping the mist included in the processing solution vapor 302 (hereinafter referred to as the mist trapping means 13b). The semiconductor substrate wafer 200, held in the wafer cassette 201, is carried into the process chamber 11.

The inside wall surface of the lid 12 is warmed by a warmer 16. The inside wall surface of the process chamber 11 is warmed by a warmer 17. To the lid 12 is connected an upper exhaust pipe 19, while to the lower part of the process chamber is connected a lower exhaust pipe 20, either pipe being connected to an exhaust pump 18. To the lid 12 of the process chamber is connected an inactive gas feed pipe 21 for feeding an inactive gas into the process chamber 11. To the steam supply means 13 is connected a constant-temperature gas feed pipe 22 for feeding a constant-temperature gas 341 into the mist trapping means 13b. To the recovery tank 15 and the steam supply means 13 is connected a drain pipe 23. To the cooler 14a is connected a cooling water supply pipe 24. Also to the cooler 14a is connected a cooling water drain pipe 25. And the exhaust pump 18 is connected to a collecting exhaust pipe 26 for expelling the exhaust gas out.

The steam drying apparatus is equipped with a heat retaining tank 50 for keeping warm the processing solution 301a. The heat retaining tank 50 includes a supply tank 51 for reserving the processing solution 301a and a warmer 52 for warming the supply tank 51 from outside. The processing solution 301a in the supply tank 51 is the raw processing solution 300 reserved in the supply tank 51 after passing through the processing solution supply pipe 53. To the supply tank 51 is connected an inactive gas feed pipe 54 for feeding an inactive gas 340 into the supply tank 51.

The processing solution 301a in the supply tank 51 is sent into the processing solution reservoir 75 through a processing solution supply pipe 55. To the supply tank 51 and the process chamber 11 is connected a pressure gauge 61. A pressure in the supply tank 51 and the process chamber 11 is regulated by means of a check valve 62. The pressure gauge 61 and the check valve 62 are provided in the process chamber protecting exhaust pipe 63 connected between the process chamber 11 and the collecting exhaust pipe 26. The pressure gauge 61 and the check valve 62 are also provided in the supply tank protecting exhaust pipe 64 connected between the supply tank 51 and the collecting exhaust pipe 26.

Next, a preparatory operation procedure will be explained.

First, operation for expelling the exhaust 330 shall be done. A predetermined amount of raw processing solution 300 is fed under pressure to the supply tank 51 of the processing solution heat retaining tank 50. The processing solution 301a in the supply tank 51 is heated to a predetermined temperature by means of the warmer 52, thereby heating the processing solution 301a. The cooling water 320 is supplied to the cooler 14a through the cooling water supply pipe 24. The steam recovery means 14 is cooled to a predetermined temperature. The waste water 321 is discharged out through the cooling water drain pipe 25. The process chamber 11 and the lid 12 of the process chamber 11 are heated and kept heated by the warmers 16 and 17. The processing solution 301b, if remaining in the steam supply means 13, and the used processing solution 305a, if present in the recovery tank 15, should be discharged out through the drain pipe 23.

Next, a drying procedure will be explained.

The semiconductor substrate wafer 200 is held in the wafer cassette 201 and then carried into the process chamber 11. The lid 12 of the process chamber is closed. At this time, the lid 12 of the process chamber is in tight contact with the process chamber 11 to thereby shut the interior of the process chamber 11 out from the outside air. While supplying the inactive gas 340 to the process chamber 11 as required, the exhaust pump 18 is operated. The supply of the inactive gas 340 is stopped, and the exhaust pump 18 is operated to lower the pressure in the process chamber 11 to a predetermined pressure. The inactive gas 340 is fed into the supply tank 51 through the inactive gas supply pipe 54. The processing solution 301b is pressurized and supplied from the processing solution heat retaining tank 50 into the steam supply means 13 through the processing solution supply pipe 55. The processing solution 301b to be supplied to the steam supply means 13 is a part or all of the processing solution 301a. The processing solution 301b held in the processing solution reservoir 75 is heated into a form of mist by the heater 13a. The mist is then passed through the mist trapping means 13b, to supply the processing solution vapor 302 into the process chamber 11. At this time, the mist included in the processing solution vapor is trapped recovery by the mist trapping means 13b. The processing solution vapor 302 flows along the inner surface of the lid 12 of the process chamber, hitting against the central part of the lid 12 of the process chamber and then flowing downwards from above the semiconductor substrate wafer 200.

On the surface of the semiconductor substrate wafer 200 placed at a normal temperature in the process chamber 11, the processing solution vapor 302 condenses. The processing solution 304a that has thus condensed flows downwards together with the wet component in accordance with the gravity while being substituted for by the wet component attaching on the surface of the semiconductor substrate wafer 200. With the continuance of condensation of the processing solution vapor 302, the temperature of the semiconductor substrate wafer 200 keeps on rising. Then, soon after the condensation of the processing solution vapor 302 stops, the surface of the semiconductor substrate wafer 200 begins drying. During this period, an excess processing solution vapor 302 condenses on the surface of the steam recovery means 14 that is cooled to a predetermined temperature by the cooler 14a; and the used processing solution including the processing solution 304a and the wet component is reserved together with the excess processing solution 304b in the recovery tank 15.

After the surface of the semiconductor substrate wafer 200 has almost dried, the heating of the processing solution 301b reserved in the steam supply means 13 is stopped, and then the supply of the processing solution vapor 302 is stopped. The exhaust pump 18 is operated to lower the pressure in the process chamber 11. Subsequently the exhaust pump 18 is operated as required while the inactive gas 340 is being supplied into the process chamber 11.

The supply of the inactive gas 340 and the operation of the exhaust pump 18 are stopped; the lid 12 of the process chamber is opened to allow the outside air into the process chamber 11. The semiconductor substrate wafer 200 held in the wafer cassette 201 is then carried out of the process chamber 11, and the processing solution 301b reserved in the processing solution reservoir 75 and the used processing solution 305a reserved in the recovery tank 15 are drained through the drain pipe 23, thus completing the drying process.

Next, details of the steam drying apparatus of embodiments 2 to 19 according to the present invention will be explained.

Embodiment 2

Figure 3:
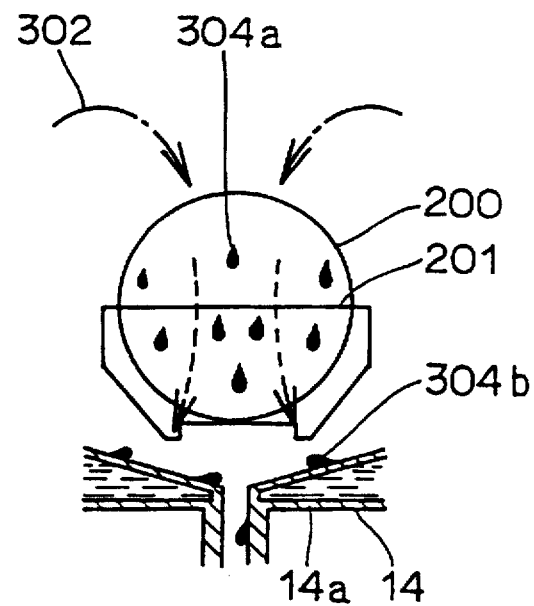
FIG. 3 is a schematic view showing a behavior of condensation of steam of a processing solution.

FIG. 3 is a schematic view showing the behavior of condensation of the processing solution vapor at the time of processing. The processing solution vapor 302 is flowing downwards from above the semiconductor substrate wafer 200 which is a material to be dried. Below the wafer 200 the excess processing solution vapor 302 is condensing on the surface of the steam recovery means 14. The used processing solution inclusive of both the processing solution 304a and the wet component is recovered together with the excess processing solution 304b below the wafer 200.

Since the processing solution vapor 302 is condensed below, the processing solution vapor 302 flowing downwards from above is forced to be drawn downwards and accordingly the stream of the processing solution vapor 302 flows downwards on the surface of the semiconductor substrate wafer 200, thus allowing the condensation to proceed exactly downwards from above. Because the flow of the processing solution 304a in the direction of gravity is done smoothly, foreign substances taken into the processing solution 304a by a surface tension remain at very little probability on the surface of the semiconductor substrate wafer 200.

Embodiment 3

Figure 4:
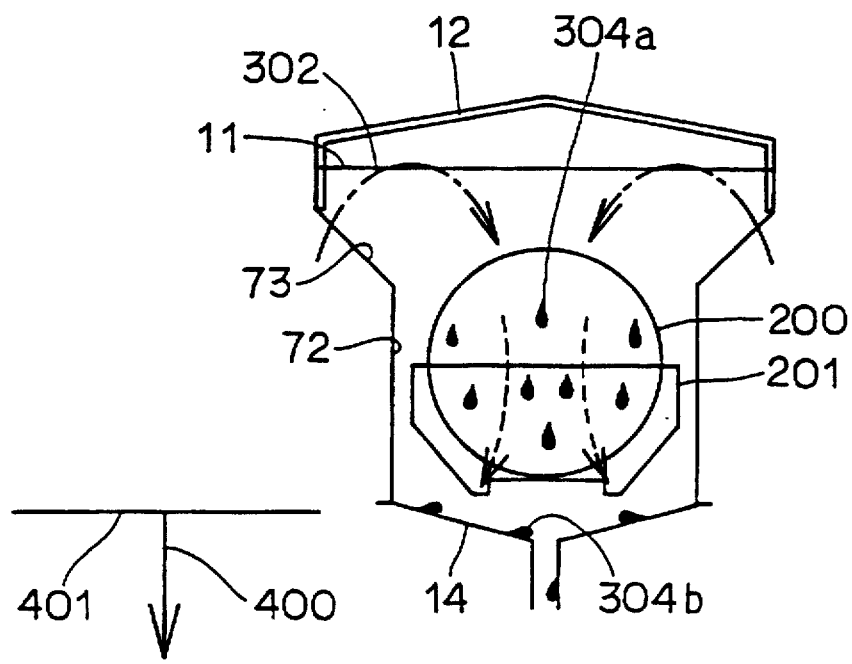
FIG. 4 is a view showing the shape of an inner surface of a process chamber.

FIG. 4 is a view showing the shape of the inside surface of the process chamber 11. In FIG. 4, a reference numeral 401 refers to a surface perpendicular to the direction of gravity 400. The inside wall surface of the process chamber 11 has the first surface 72 which is formed in the lower part thereof and is substantially in parallel with the direction of gravity 400, and the second surface 73 which extends from the upper end portion of the first surface 71 and is bent outwards to face the inside wall surface of the lid 12.

Since the inside wall surface of the process chamber is so formed as not to have a surface perpendicular to the direction of gravity 400, it is possible to prevent the accumulation of the used processing solution. Consequently acid and alkali components contained in the wet component holding on the surface of the semiconductor substrate wafer 200 will not remain on the inside wall surface of the process chamber 11. As a result, the process chamber 11 is hardly subject to corrosion if formed of a metal such as stainless steel.

Embodiment 4

Figure 5:
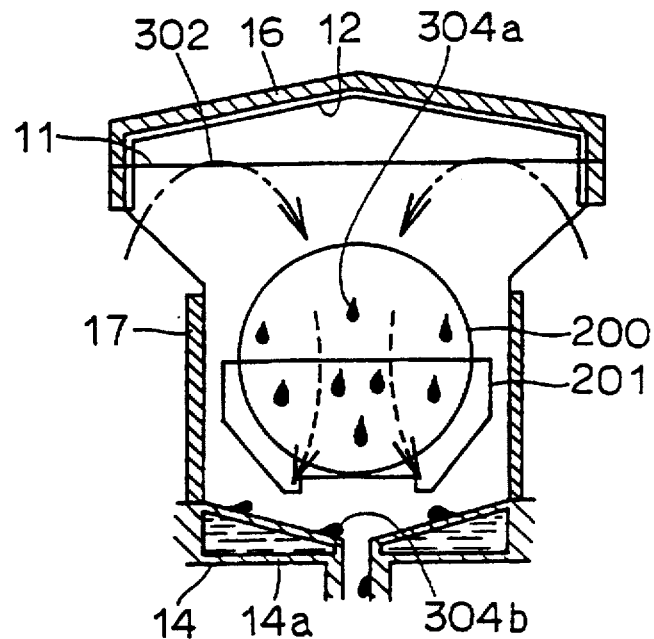
FIG. 5 is a schematic view showing the mechanism for retaining heat of the process chamber.

FIG. 5 is a schematic view showing a heat retaining mechanism of the process chamber 11. The warmer 17 is mounted on the outside side wall surface of the process chamber. Further, the warmer 16 is mounted on the lid 12 of the process chamber. The interior of the process chamber 11 is kept at a predetermined temperature by the use of these warmers 16 and 17, thereby preventing the condensation of the processing solution vapor 302 on the inner surface of the processing chamber 11. As a result almost all the processing solution vapor 302 is condensable on the surface of the semiconductor substrate wafer 200, thus enabling to decrease the consumption of the processing solution.

Embodiment 5

Figure 6:
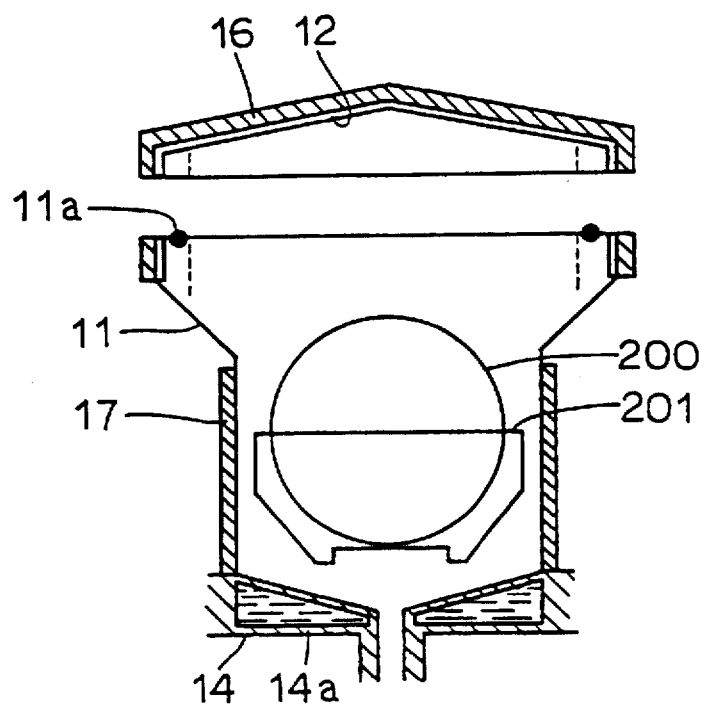
FIG. 6 is a schematic view showing the process chamber and a lid in a hermetically closed position.

FIG. 6 is a schematic view showing the state of the lid 12 of the process chamber which is in tight contact with the process chamber 11. In the upper end of the process chamber 11 is provided an O-ring 11a. A seal member such as the O-ring 11a is inserted between the process chamber 11 and the lid 12 of the process chamber, and can close the interior of the process chamber 11 from the outside air during the processing. It is, therefore, possible to prevent entry of the outside air into the process chamber 11 and also to prevent leakage of the processing solution vapor 302 to the outside. In consequence, the oxygen concentration in the process chamber 11 becomes less than the critical value of combustion and explosion, thus ensuring very high safety for prevention of explosion.

Embodiment 6

Figure 7:
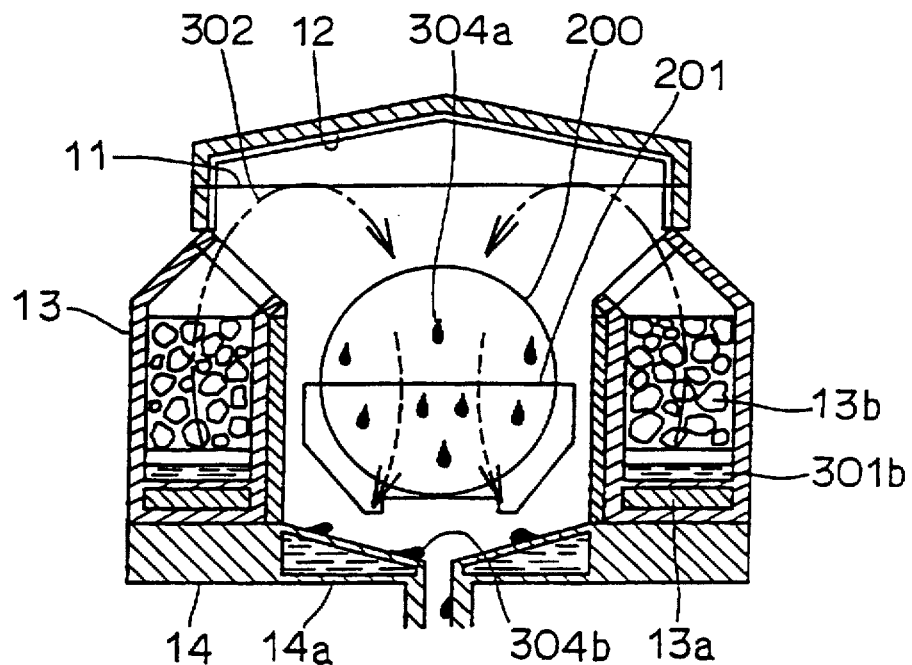
FIG. 7 is a schematic view showing a relation between the process chamber and a steam supply means.

FIG. 7 is a schematic view showing a relation between the process chamber 11 and the steam supply means 13. The steam supply means 13 is provided on either side of the process chamber 11 with the semiconductor substrate wafer 200 disposed at center in the process chamber. The processing solution vapor 302 supplied from the steam supply means 13 is supplied into the process chamber 11 along the inner surface of the lid 12 of the process chamber.

Figure 24:
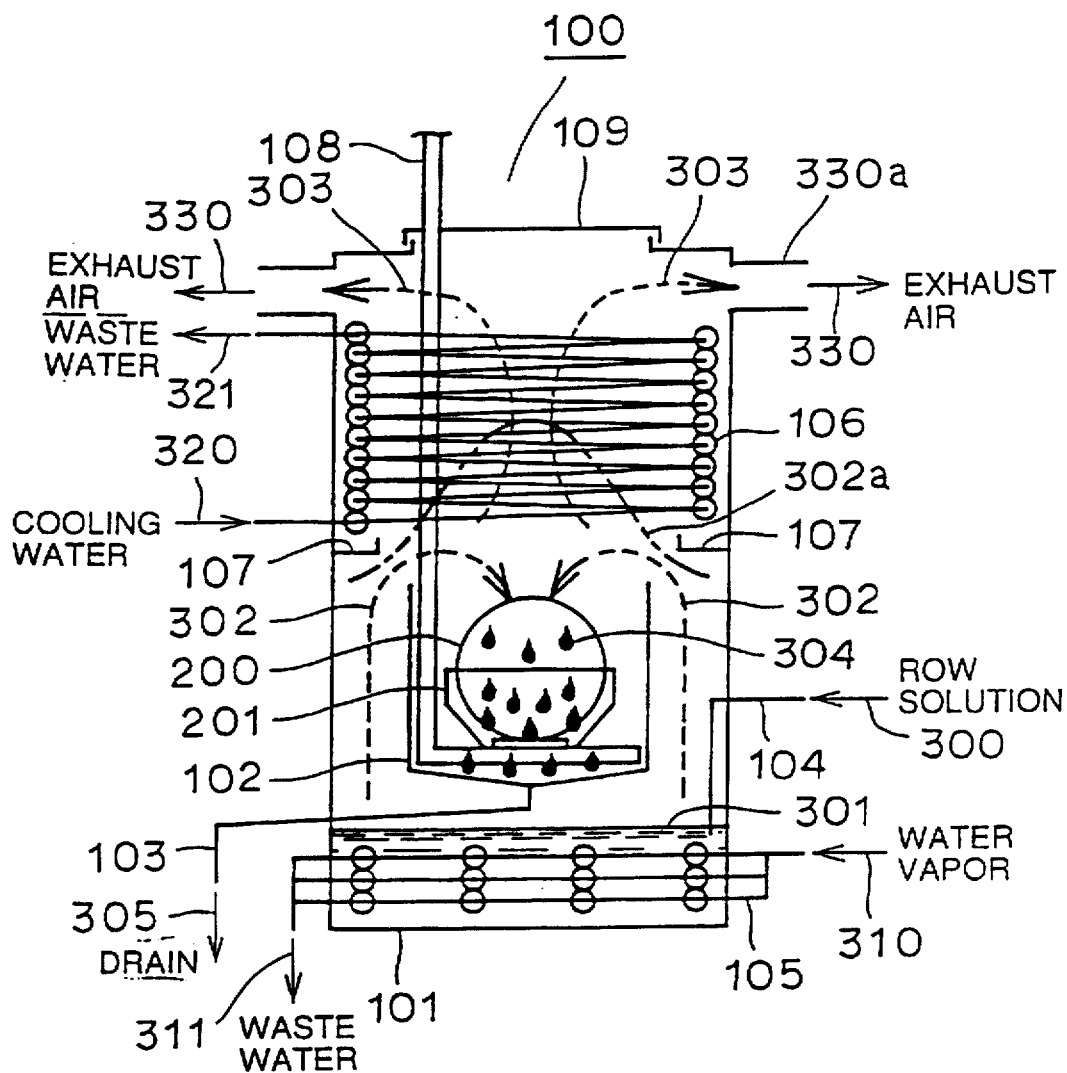
FIG. 24 is a schematic view of a prior art steam drying apparatus.

The streams of the processing solution vapor 302 supplied from the steam supply means 13 provided on both sides of the process chamber 11 collide with each other at the central part of the lid of the process chamber, flowing in against the semiconductor substrate wafer 200 set below. The lid 12 of the process chamber can fully display the effect of the present invention if it has a shape to rectify the flow of the processing solution vapor 302, therefore the construction of the apparatus can be simplified as compared with a prior art apparatus shown in FIG. 24.

The position of the semiconductor substrate wafer 200 during processing can be made shallow from the upper end part of the process chamber 11 and therefore no elevator is needed. The apparatus, therefore, can be made considerably small as compared with the prior art apparatus.

Embodiment 7

Figure 8:
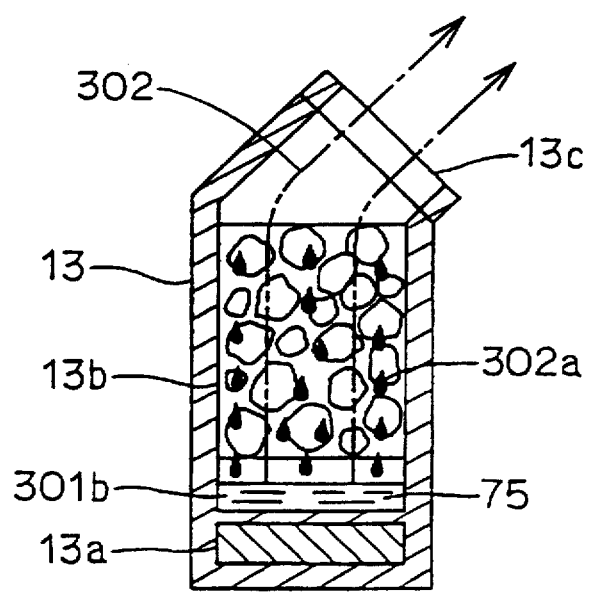
FIG. 8 is a schematic view showing a construction of the steam supply means.

FIG. 8 is a schematic view showing the construction of the steam supply means 13. The seam supply means is provided with a processing solution reservoir 75 for temporarily reserving the processing solution before the solution turns into the processing vapor. Under the processing solution reservoir is provided the heater 13a for changing the solution to the processing solution vapor 302. Between the processing solution reservoir 75 and the steam supply port 13c is provided the mist trapping means 13b for trapping the mist 302a included in the processing solution vapor 302. The mist trapping means 13b is formed of a porous or mesh-like member.

With the generation of the processing solution vapor 302 there is produced a mist 301a inclusive of impurities as a nucleus already present in the processing solution 301b which is a raw processing solution. The mist 302a, being very large as compared with molecules of the processing solution vapor including no impurities, will stay on the surface of the porous or mesh-like member 13b when it touches the surface, gradually gathering into a liquid, which will then flow downwards. Because the entry of the mist 302a into the process chamber 11 is prevented in this manner, no impurities will deposit on the surface of the semiconductor substrate wafer 200, and accordingly the characteristics of the wafer will not be deteriorated.

Embodiment 8

Figure 9:
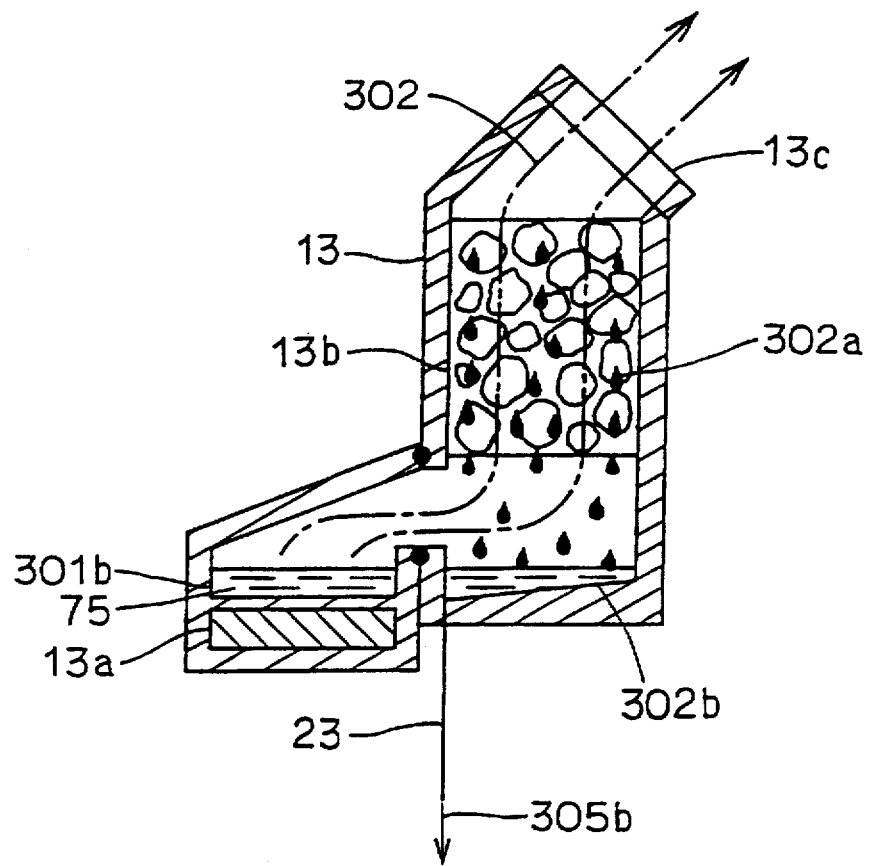
FIG. 9 is a schematic view showing another embodiment of the steam supply means.

FIG. 9 is a schematic view showing another embodiment of the steam supply means 13. The processing solution reservoir 75 and the mist trapping means 13b are horizontally shifted from each other so that they will not overlap each other in a vertical direction. Beneath the mist trapping means 13b is provided a mist condensate reservoir chamber 302 for holding a condensate of the mist 302a dropping from the mist trapping means 13b.

Since the processing solution reservoir 75 and the mist trapping means 13b are shifted in the horizontal direction so that they will not overlap each other in the vertical direction, the mist 302a will not be returned to the processing solution reservoir 75. Consequently, the mist 302a can be prevented from going into the process chamber 11. And accordingly it is possible to prevent impurity deposition on the surface of the semiconductor substrate wafer 200. The mist condensate 302a is held in the mist condensate reservoir chamber 302b, and is discharged as a used solution 305b through the drain pipe 23 by each processing.

Embodiment 9

Figure 10:
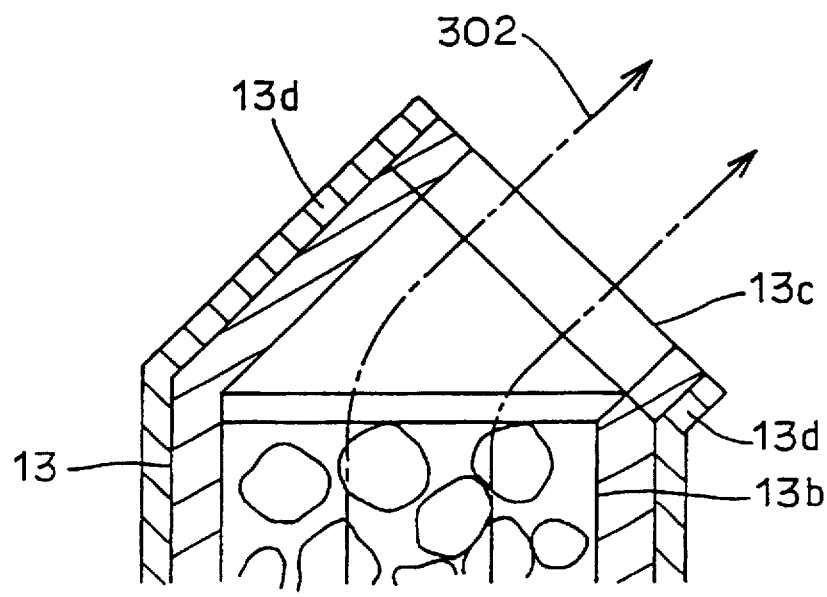
FIG. 10 is a schematic view showing the construction of a steam supply port of the steam supply means.

FIG. 10 is a schematic view showing the construction of the steam supply port 13c of the steam supply means 13.

The warmer 13d for heating the steam supply port 13c is provided around the steam supply port 13c. The steam supply port 13c is heated to a predetermined temperature by the warmer 13d and this portion is kept at the predetermined temperature to thereby maintain the processing solution vapor 302 which is passing, at a temperature near the boiling point, thus decreasing a temperature difference of the processing solution vapor 302 and at the same time minimizing a unit quantity of heat required to be removed by the semiconductor substrate wafer 200 for the condensation of the processing solution vapor 302. Since the total quantity of heat that the semiconductor substrate wafer 200 can remove will not vary, it is possible to condense much more processing solution vapor 302 on the surface of the semiconductor substrate wafer 200. As the vapor condensation on the surface of the semiconductor substrate wafer 200 is done at a high efficiency, substitution of the wet component with the processing solution vapor can be done exactly.

Embodiment 10

Figure 11:
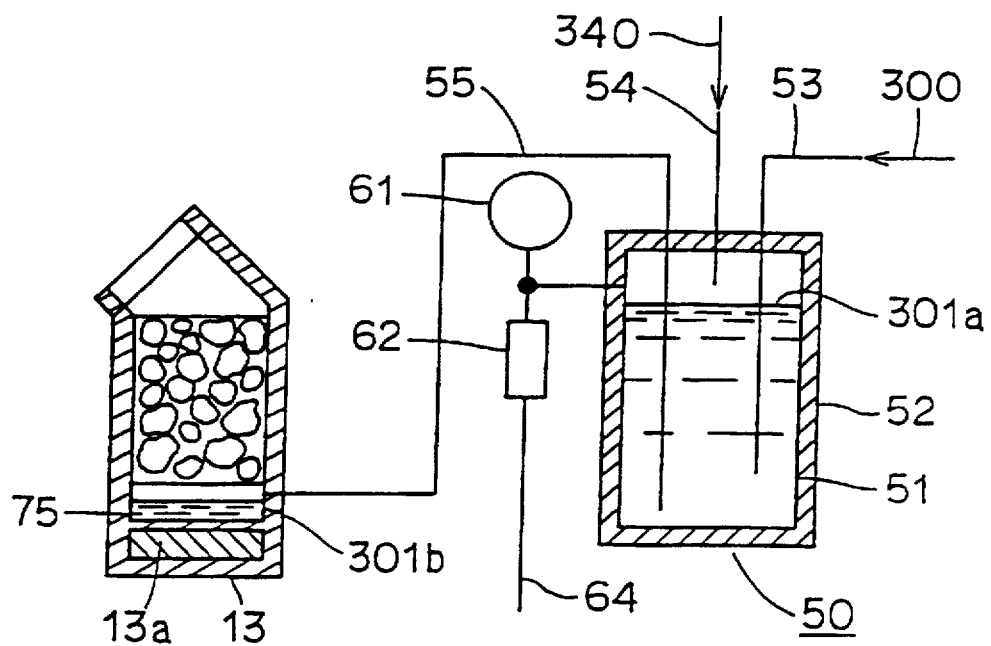
FIG. 11 is a schematic view showing a relation between an insulated tank for the processing solution and a steam generating means.

FIG. 11 is a schematic view showing a relation between a processing solution heat retaining tank 50 and the steam generating means 13. In the processing solution heat retaining tank 50, the processing solution 301a is heated up to a predetermined temperature near the boiling point and kept at this temperature. During processing, the processing solution 301b is supplied into the processing solution reservoir chamber 75 of the steam supply means 13. The processing solution 301b thus supplied is further heated by the heater 13a to produce the processing solution vapor 302. Since the temperature of the processing solution 301b supplied into the steam supply means 13 is near the boiling point, the processing solution vapor 302 can be produced rapidly simply by heating a little at the steam supply means 13. The thus accelerated generation of the processing solution vapor 302 can decrease the processing time.

Embodiment 11

Figure 12:
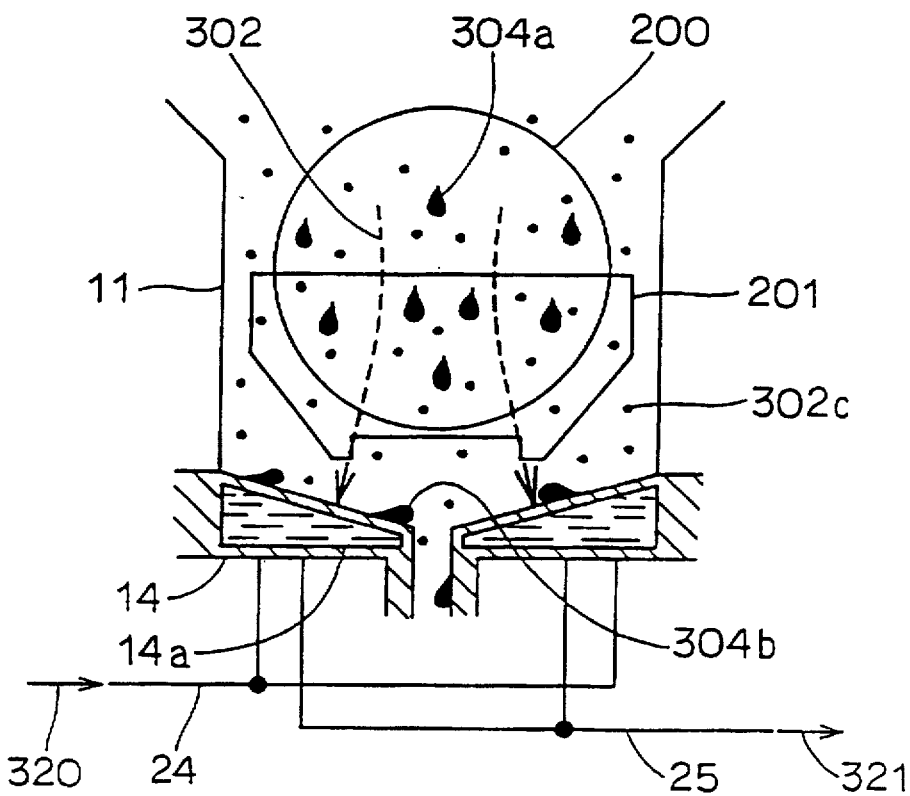
FIG. 12 is a schematic view showing the construction of a steam recovery means.

FIG. 12 is a schematic view showing the construction of the steam recovery means 14. In this drawing, the reference numeral 302c refers to a molecule of the processing solution vapor. Below the semiconductor substrate wafer 200 is provided the steam recovery means 14 for condensing the excess processing solution vapor 302 and also recovering the used processing solution inclusive of the processing solution 304a and the wet component. The molecule 302c of the excess processing solution vapor contributing to condensation on the surface of the semiconductor substrate wafer 200 flows down along the down flow of the processing solution vapor 302, reaching the surface of the steam recovery means 14, where the vapor is reduced to liquid. Since almost all the processing solution vapor 302 produced can be recovered as the liquid, the processing solution recovering efficiency can be largely improved.

Embodiment 12

Figure 13:
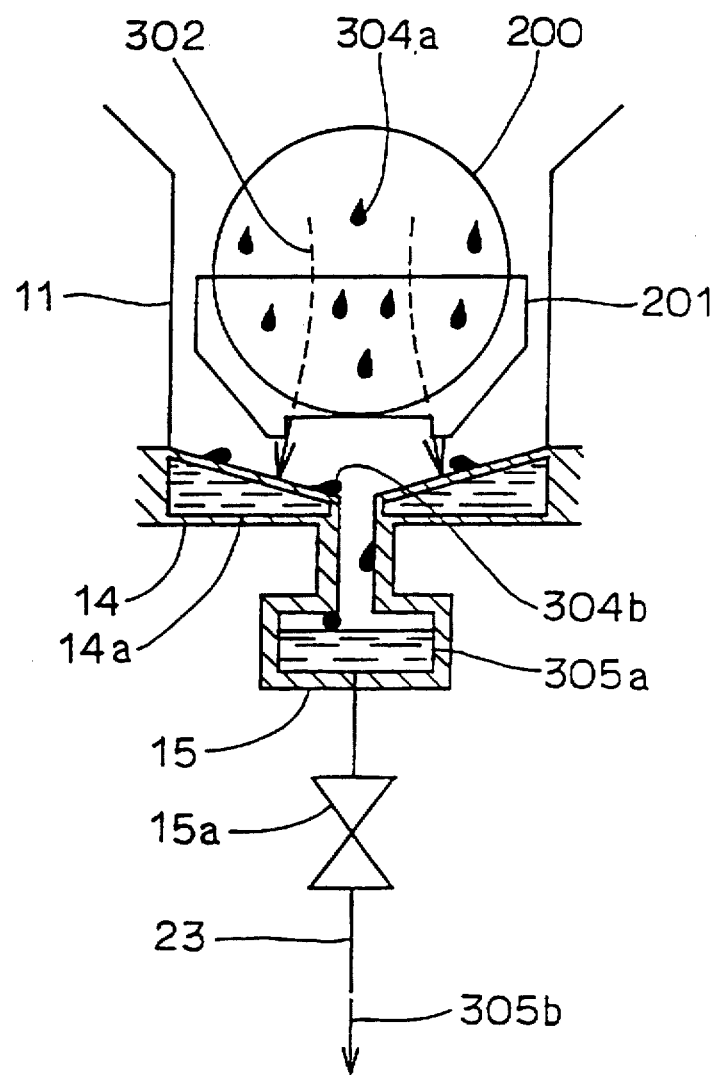
FIG. 13 a schematic view showing a relation between a cooler and a recovery tank.

FIG. 13 is a schematic view showing a relation between the cooler 14a and the recovery tank 15. To the recovery tank 15 is connected the drain pipe 23 for discharging out the used processing solution 305a that has been recovered. In the drain pipe 23 is installed an on-off valve 15a. During processing operation, the drain pipe 23 is closed by the on-off valve 15a to temporarily hold the recovered processing solution in the recovery tank 15. Thus an effect of a pressure change from the drain pipe 23 can be prevented during the processing operation, and therefore the processing is carried out in a very stabilized manner without disturbing the down flow of the processing solution vapor 302 in the process chamber 11.

Embodiment 13

Figure 14:
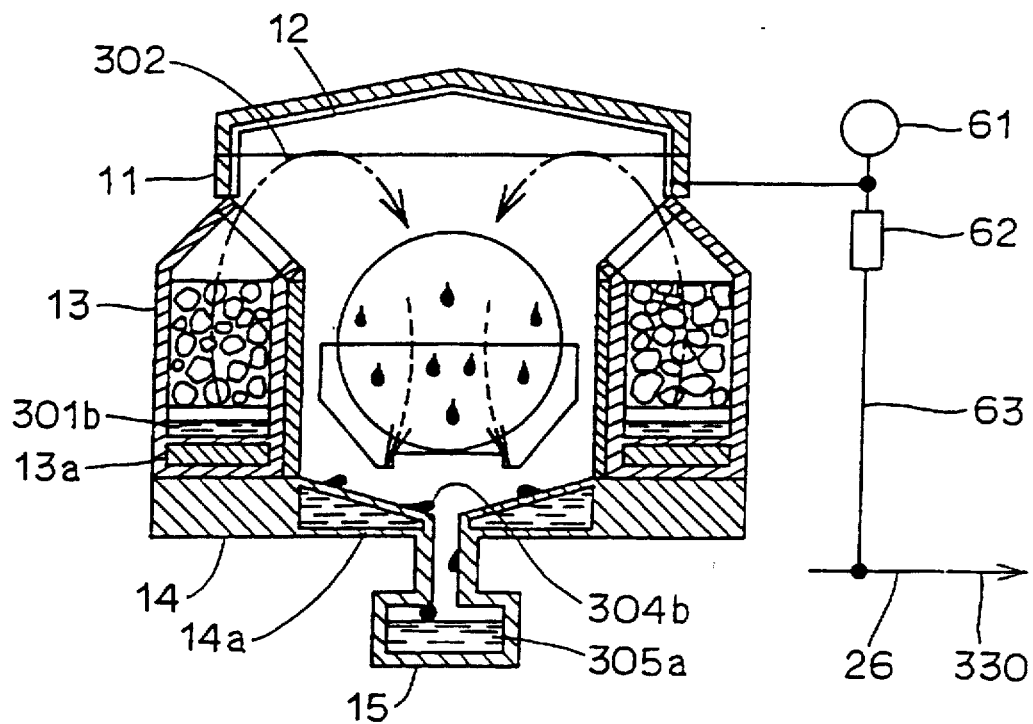
FIG. 14 is a schematic view of the steam drying apparatus with safety countermeasure for the process chamber taken into consideration.

FIG. 14 is a schematic view of the steam drying apparatus with a safety countermeasure for the process chamber taken into consideration. A check valve 62 is inserted in the protective exhaust pipe 63 connected to the process chamber 11. The provision of the check valve 62 can restrain the pressure in the process chamber 11 below the predetermined pressure. Therefore the process chamber 11 is protected from expansion and breakage and also leakage of the processing solution vapor 302 is prevented. Since the pressure in the process chamber 11 is held below the critical value of explosion if a dangerous processing solution is used, very high safety from explosion is ensured.

Embodiment 14

Figure 15:
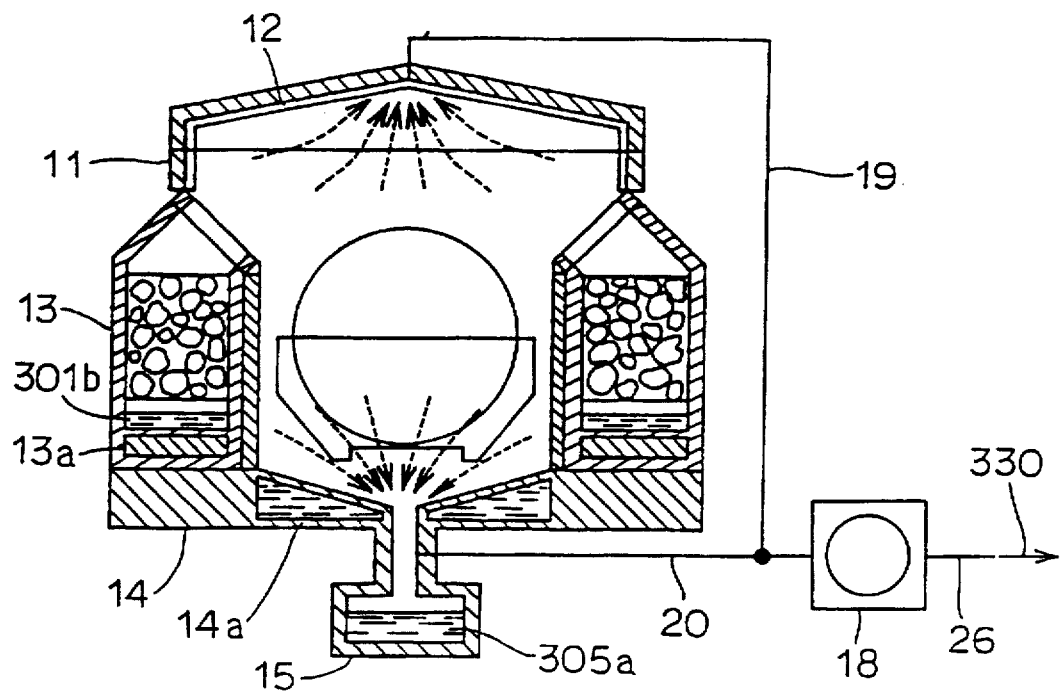
FIG. 15 is a schematic view of the steam drying apparatus with another safety countermeasure for the process chamber taken into consideration.

FIG. 15 is a schematic view of the steam drying apparatus with another safety countermeasure for the process chamber 11 taken into consideration. To the lid 12 of the process chamber is connected one end of the upper exhaust pipe 19 to discharge a gas out of the process chamber 11. The other end of this upper exhaust pipe 19 is connected to the collecting exhaust pipe 26, inside of which the exhaust pump 18 is mounted. Operating the exhaust pump 18 before and after the drying process lowers the pressure in the process chamber 11 to a predetermined value or less, thereby improving the efficiency of substitution between the processing solution vapor 302 and the outside air and also lowering the oxygen concentration in the process chamber 11. As a result, the oxygen concentration in the process chamber 11 can be held below the critical value of combustion and explosion if a dangerous processing solution is used, safety from explosion is improved very high.

Embodiment 15

Figure 16:
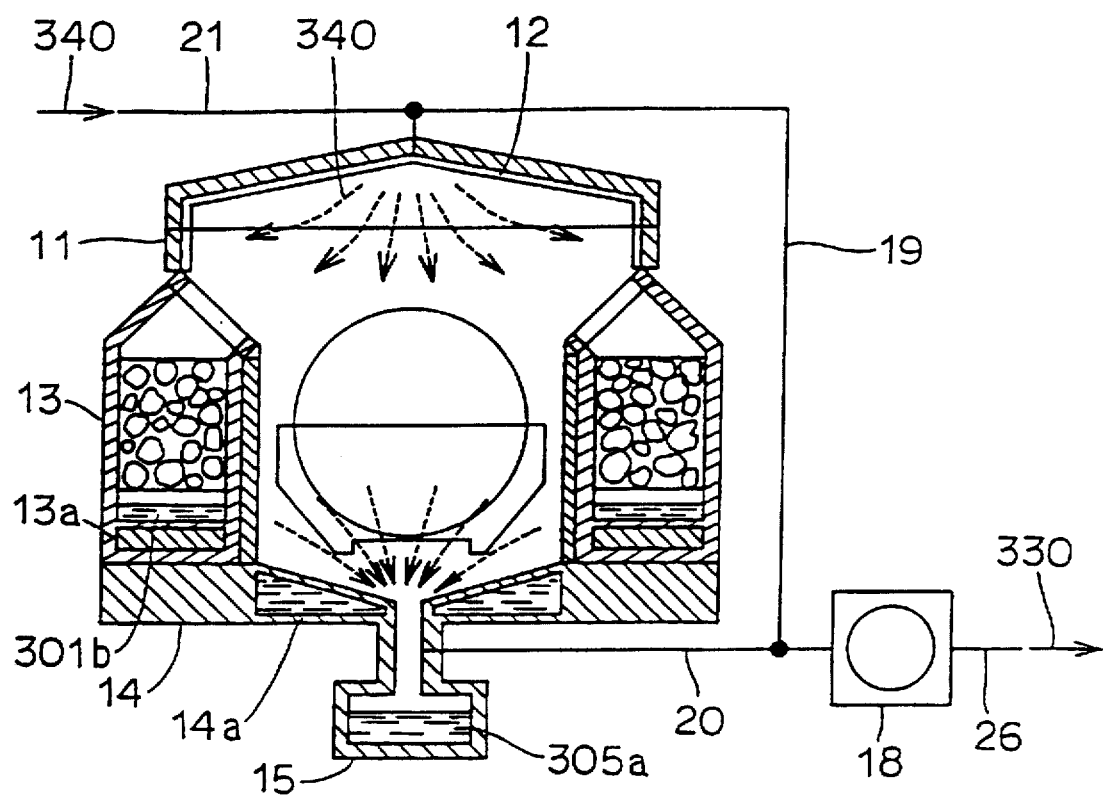
FIG. 16 is a schematic view of the steam drying apparatus with another safety countermeasure for the process chamber taken into consideration.

FIG. 16 is a schematic view of the steam drying apparatus with another safety countermeasure for the process chamber 11 taken into consideration. To the lid 12 of the process chamber 11 is connected the inactive gas feed pipe 21 for leading the inactive gas 340 into the process chamber 11. Before and after the drying process, the inactive gas 340 from the inactive gas feed pipe 21 is supplied into the process chamber 11 to thereby decrease the concentration of oxygen in the process chamber. Therefore, the concentration of oxygen in the process chamber 11 is below the critical value of combustion and explosion, thus ensuring very high safety from explosion even when a dangerous processing solution is used.

Embodiment 16

Figure 17:
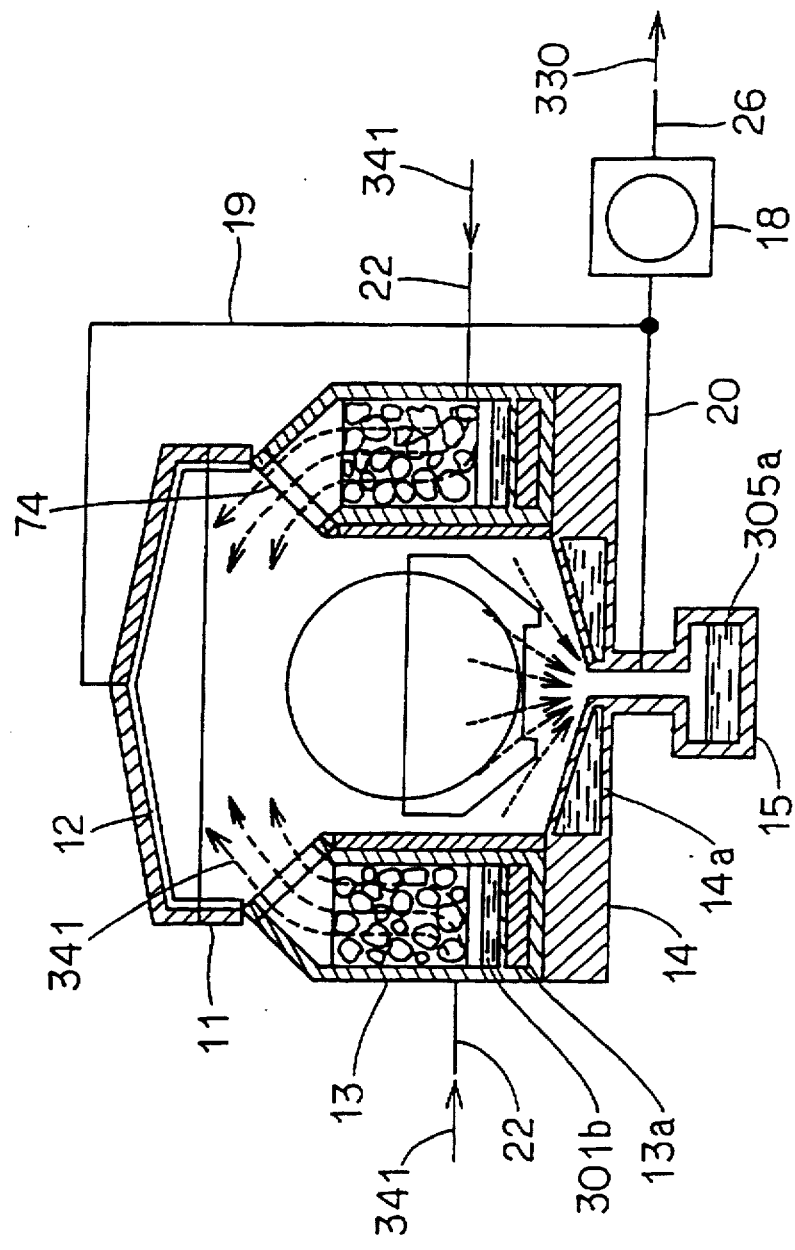
FIG. 17 is a schematic view of the steam drying apparatus adopting another method for retaining heat of the steam supply means.

FIG. 17 is a schematic view of the steam drying apparatus adopting another process for heating the steam supply means. To the steam supply means 13 is connected the constant-temperature gas feed pipe 22 for feeding, into the steam supply means 13, the constant-temperature gas 341 kept at a predetermined temperature. Before and after the drying process, the constant-temperature gas 341 in the process chamber 11 is supplied through the steam supply port 13c, thereby maintaining the steam temperature at a predetermined value at the steam supply port 74 of the steam supply means 13.

Similarly to the embodiment 9, the temperature difference of the processing solution vapor 302 can be decreased, and further the unit quantity of heat required to be removed by the semiconductor substrate wafer 200 for the purpose of condensation of the processing solution vapor 302 is decreased as much as possible. Because of the improved efficiency of condensation on the surface of the semiconductor substrate wafer 200, substitution of the processing solution wafer with the wet component can be done exactly.

Embodiment 17

Figure 18:
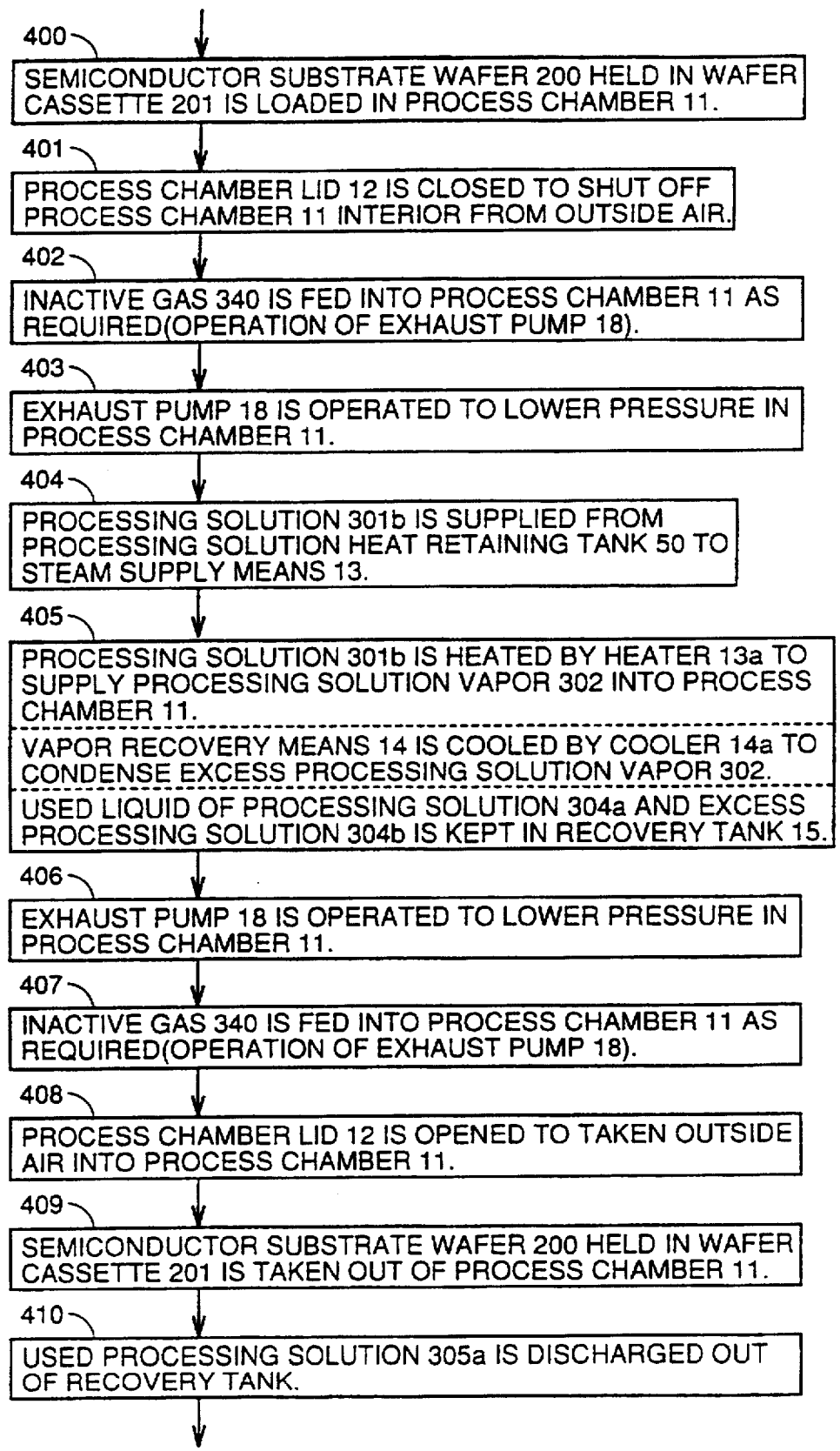
FIG. 18 is a flowchart showing a series of operation sequences during drying processing.

FIG. 18 is a view showing a series of drying operation sequences. In this drawing, reference numerals 400 to 410 roughly denote steps of the operation sequences. By referring to FIGS. 1 and 18, a semiconductor substrate wafer which is a material to be dried is loaded in the process chamber 11 (400). The interior of the process chamber 11 is closed to shut off the outside air (401). The inactive gas 340 is fed into the process chamber 11 as required (402). The pressure in the process chamber 11 is lowered to a predetermined pressure or less (403).

The processing solution 301b is supplied to the steam supply means 13 (404). The processing solution vapor 302 is supplied by the steam supply means 13 into the process chamber 11 and at the same time the semiconductor substrate wafer 200 is dried while recovering the excess processing solution vapor 302 and the used processing solution 304b by the steam recovery means 14 (405). The pressure in the process chamber 11 is decreased to a predetermined value or lower (406). The inactive gas 340 is fed into the process chamber 11 as required (407). The outside air is taken into the process chamber 11 (408), thereafter the semiconductor substrate wafer 200 thus processed is taken out of the process chamber 11 (409). The used processing solution 305b recovered is discharged (410).

Embodiment 18

Figure 19:
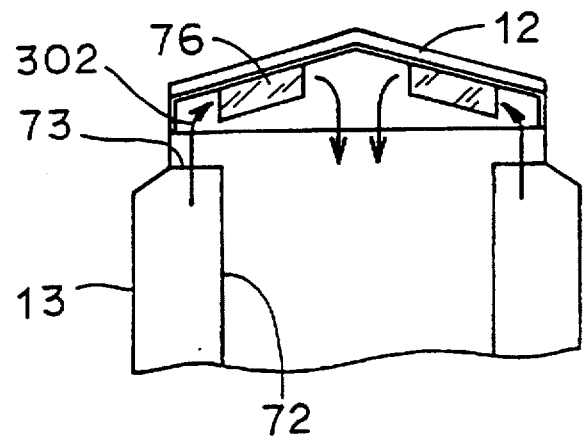
FIG. 19 is a view showing another embodiment for regulating the flow of processing solution vapor.
Figure 20:
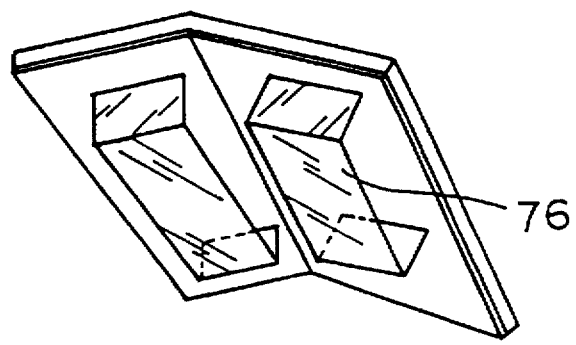
FIG. 20 is a bottom view of the lid of the process chamber.
Figure 21:
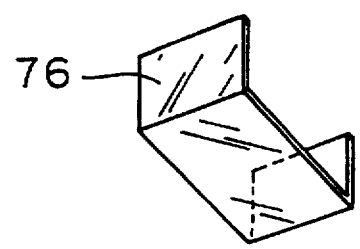
FIG. 21 is a schematic view showing a flow regulating means mounted on the lid of the process chamber, for regulating the flow of processing solution vapor.

FIG. 19 shows an embodiment of another means for regulating the flow of the processing solution vapor so that the processing solution vapor supplied through the steam supply port will flow along the inner wall surface of the lid. FIG. 19 is a schematic view showing the upper part of the process chamber 11 and a part of the lid 12. FIG. 20 is a bottom view of the lid of the process chamber. FIG. 21 is a schematic view of a processing solution vapor flow regulating means mounted on the lid of the process chamber. The inner wall surface of the process chamber 11 consists of the first surface 72 and the second surface 73 which is perpendicular to the first surface 72. In the second surface 73 is provided a steam supply port through which the processing solution vapor is fed into the process chamber 11.

The processing solution vapor 302 supplied from the steam supply means 13 into the process chamber 11 flows vertically upwards, hitting against the inner surface of the lid 12 of the process chamber 11, being changed to the vapor flowing along the inner wall surface of the lid 12 by the means 76 for regulating the flow of the processing solution vapor 13, hitting against the central part of the lid 12 of the process chamber, and then flowing towards the semiconductor substrate wafer 200 loaded below.

Embodiment 19

Figure 22:
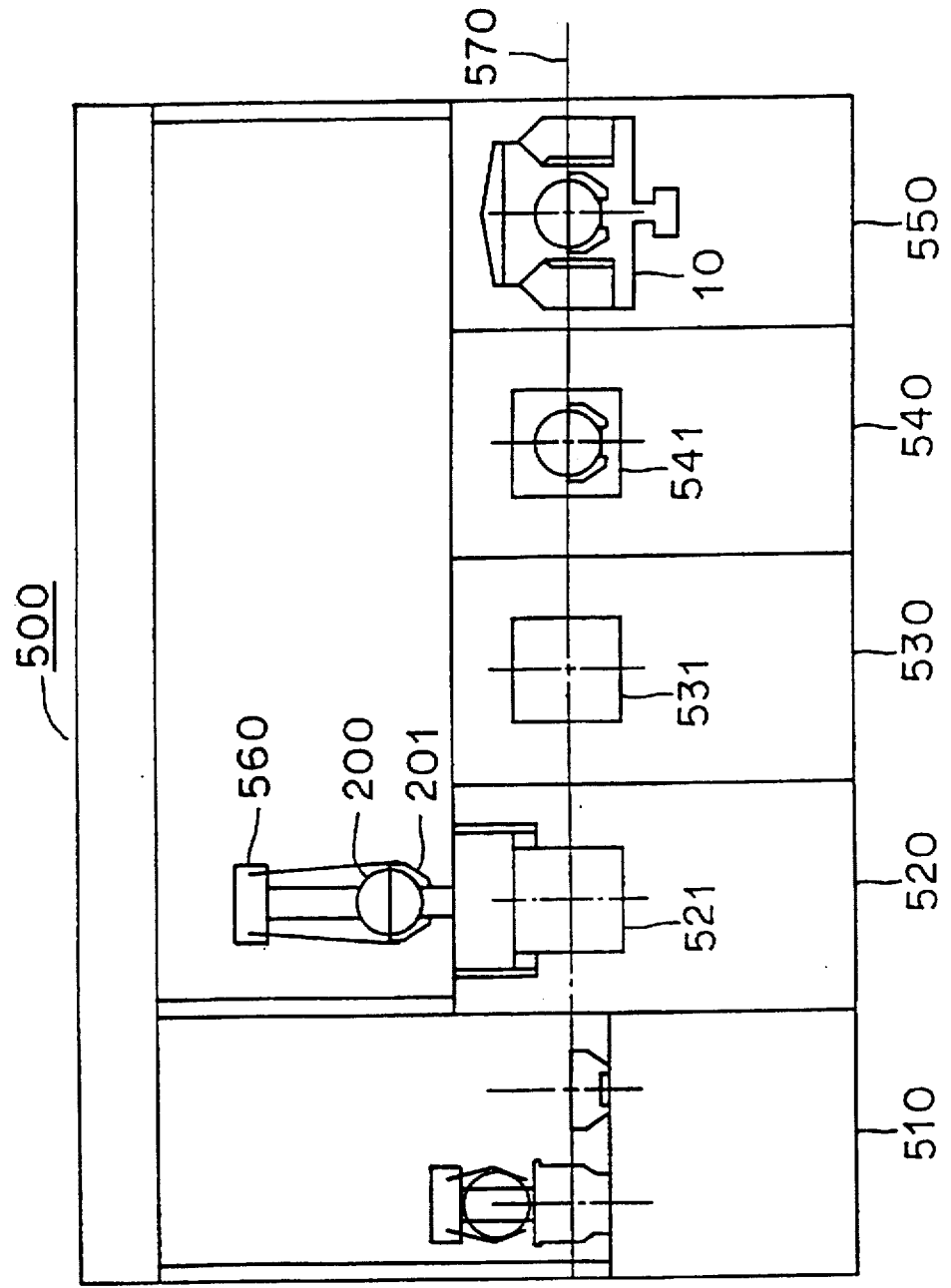
FIG. 22 is a schematic view of the cleaning apparatus pertaining to the embodiment 19.

FIG. 22 is a schematic view of a cleaning apparatus 500 incorporating the steam drying apparatus of the embodiment 1. The cleaning apparatus 500 has a loader/unloader chamber 510 for loading and unloading the semiconductor substrate wafer 200. To this loader/unloader chamber 510 is connected a chemical processing tank 520 for chemically processing the semiconductor substrate wafer 200. To the chemical processing tank 520 is connected a first water washing section 530 having a first water washing chamber 63 for rinsing the semiconductor substrate wafer 200. To the first water washing section 530 is connected a second water washing section 540 equipped with a second water washing tank 541. And to the second water washing section 540 is connected a drying section 550 provided with the steam drying apparatus 10 of the embodiment 1.

The semiconductor substrate wafer 200 is held in the wafer cassette 201 and carried by a transfer robot 560. In the drawing, the line indicated by a reference numeral 570 denotes a loading height of the semiconductor substrate wafer.

In the cleaning apparatus 500 of the present embodiment, the steam drying apparatus 10 of the embodiment 1 is disposed inside the drying section 550; therefore it is possible not only to prevent remaining of foreign substances and deposition of impurities on the surface of the semiconductor substrate wafer 200 but to adjust the loading height of the semiconductor substrate wafer 200 in the chemical tank 521, the first water washing tank 531, and the second water washing tank 541. Consequently, the semiconductor substrate wafer 200 can be directly loaded by the transfer robot 560, requiring the use of no elevator and accordingly enabling to make the apparatus smaller as compared with the prior art example.

Embodiment 20

Figure 23:
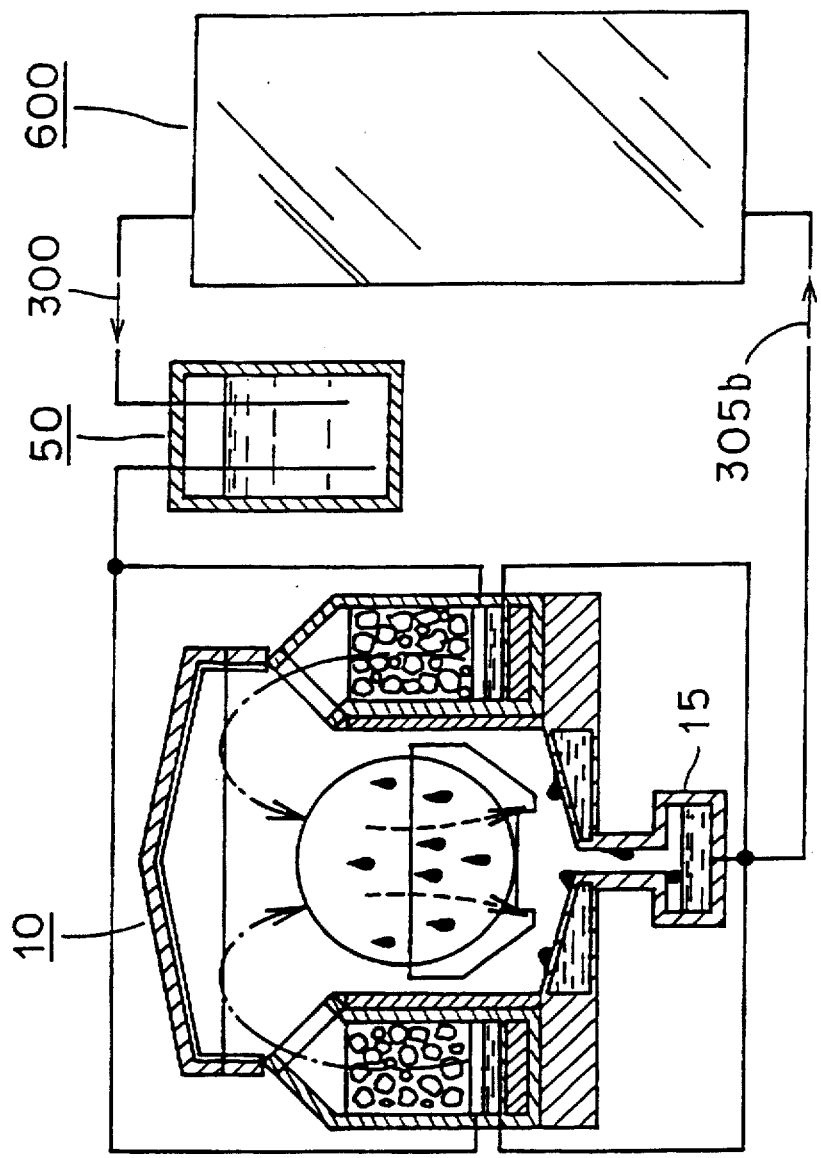
FIG. 23 is a schematic view of the steam drying apparatus pertaining to the embodiment 20.

FIG. 23 is a schematic view of the steam drying apparatus pertaining to another embodiment. The steam drying apparatus is equipped with a refining apparatus 600 with its one end connected to the recovery tank 15 and the other end connected to the processing solution heat retaining tank 50. Most of the raw processing solution 300 supplied through the processing solution heat retaining tank 50 is used for processing and, after use, is sent as a used solution 305 to the refining apparatus 600. In this refining apparatus 600, the wet component present on the surface of the semiconductor substrate wafer 200, and foreign substances and impurities that have entered the solution, are all separated from the used processing solution 305b, being refined as the raw processing solution 300, which is then sent into the processing solution heat retaining tank 50. The processing solution discharged from this circulation system is little, thus enabling to largely reduce the consumption of the processing solution.

Embodiment 21

Figure 25:
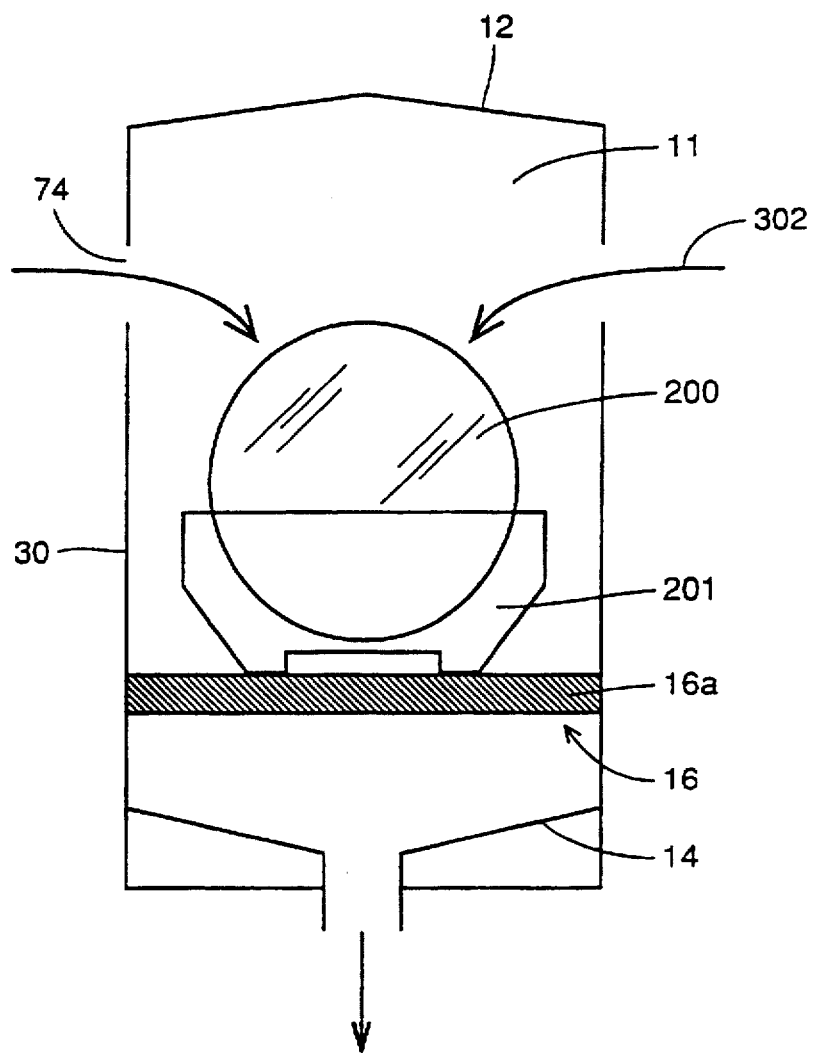
FIG. 25 is a schematic view of the steam drying apparatus pertaining to the embodiment 21.

FIG. 25 is a schematic view of the steam drying apparatus pertaining to the embodiment 21. The apparatus is provided with the process chamber 11 for loading the semiconductor substrate wafer 200. In the upper part of the process chamber 11 is provided the process chamber lid 12. Also in the upper part of the process chamber 11 is provided the steam supply port 74 for supplying the processing solution vapor 302 into the process chamber 11. In the process chamber 11 is disposed the wafer cassette 201 for supporting the semiconductor substrate wafer 200. At the bottom of the process chamber 11 is disposed the cooler 14 for cooling to condense the processing solution vapor 302 that has passed through the interior of the process chamber 11. Between the wafer cassette 201 and the cooler 14 is provided a flat porous plate 16a which is one example of the vapor rise preventing means 16 which prevents the processing solution vapor 302 that has hit on the cooler 14, from rising towards the semiconductor substrate wafer 200.

Next, operation will be explained.

Figure 27:
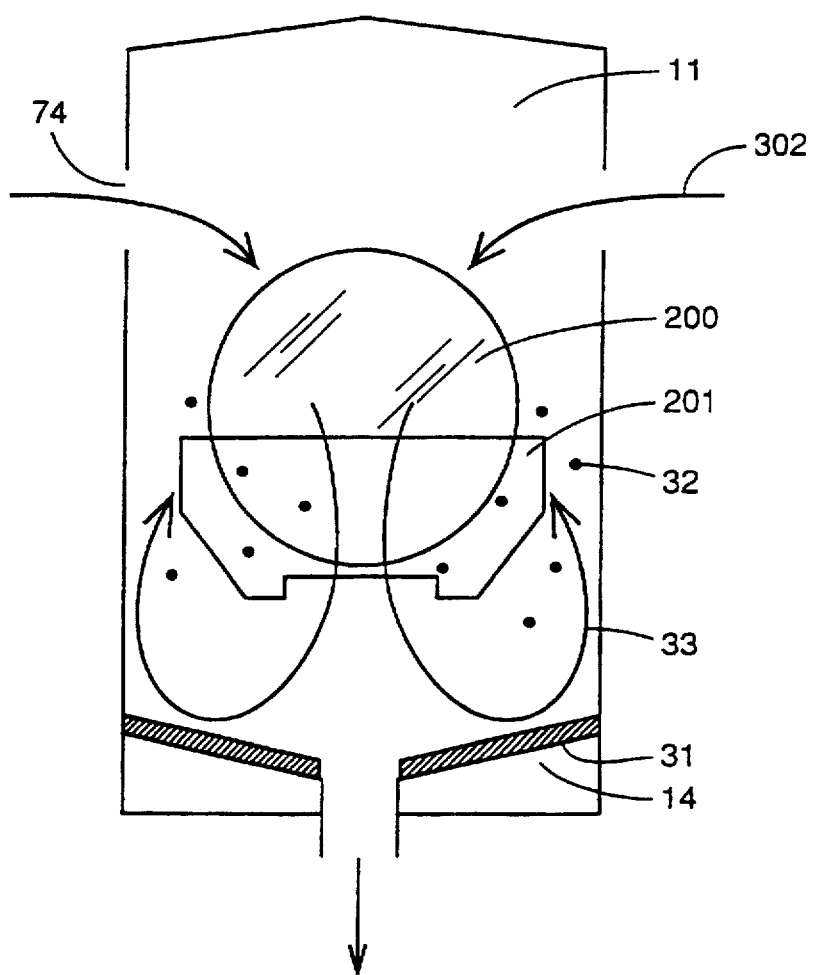
FIG. 27 is a view showing a problem arising when there is provided no means for preventing a rise of vapor.

First, a problem arising when no vapor rise preventing means is provided will be explained by referring to FIG. 27. In FIG. 27, if no vapor rising means is provided, the processing solution vapor 302 supplied into the process chamber 11 through the steam supply port 74 strikes directly against the cooler 14, and therefore is over-cooled to produce mists in the processing solution vapor 302. The foreign substances that have attached on the semiconductor substrate wafer 200 and the wafer cassette 201 during the initial period of processing fall onto the cooler 14, staining the surface of the cooler 14 to form a contaminated surface 31. The processing solution vapor 302 supplied flows as indicated by the arrow 33 in the drawing, consequently the foreign substances 32 on the cooler 14 is raised into the process chamber 11, contaminating the semiconductor substrate wafer 200.

In the meantime, in the apparatus shown in FIG. 25 there is provided a flat porous plate 16a between the semiconductor substrate wafer 200 and the cooler 14.

Figure 26:
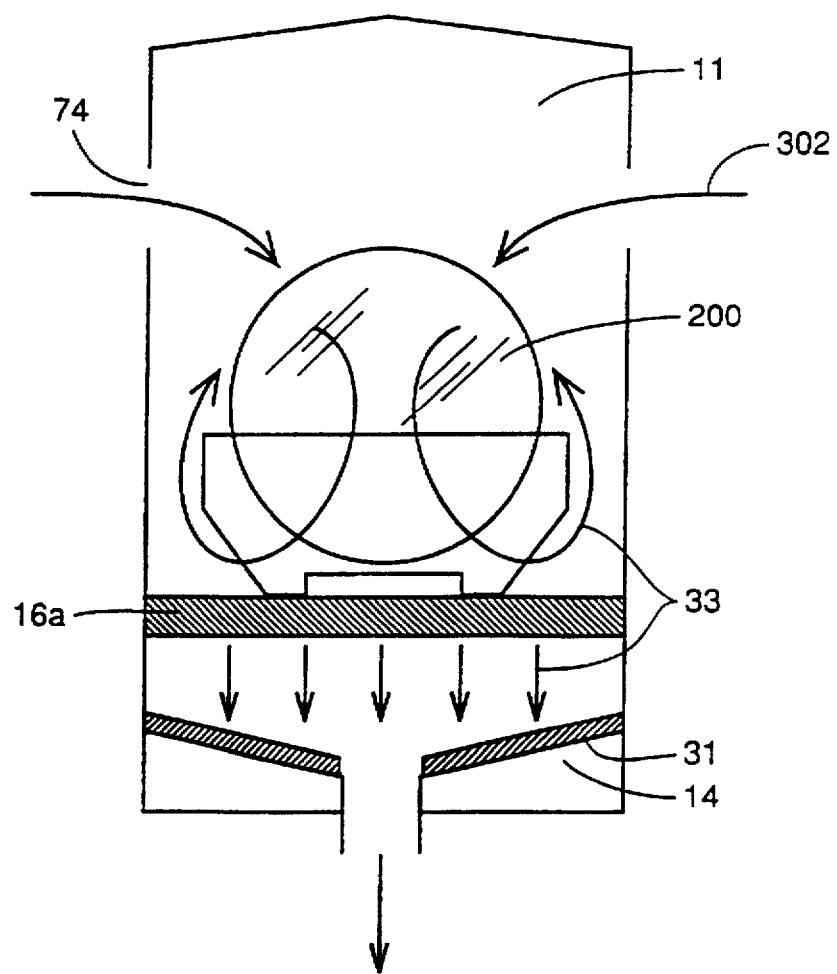
FIG. 26 is a view explaining the operation of the drying apparatus pertaining to the embodiment 21.

In FIG. 26, the processing solution vapor 302 that has entered the process chamber 11 and reached the surface of the semiconductor substrate wafer 200 flows through a clearance of the flat plate 16a, being gradually cooled down into liquid by the cooler 14 and recovered. At this time, because of the presence of the flat plate 16a, the processing solution vapor 302 that has hit against the cooler 14 is blocked from rising toward the semiconductor wafer 200.

The present embodiment has the following advantage. That is, a predetermined amount of vapor is stored in the process chamber 11 even when the amount of the processing solution vapor 302 to be supplied at the steam supply port 74 varies. Consequently, the semiconductor substrate wafer 200 is constantly exposed to a uniform quantity of processing vapor, allowing uniform condensation on the semiconductor substrate wafer 200. Therefore it is possible to efficiently replace the wet component present on the surface of the semiconductor substrate wafer 200 with the processing solution even during the initial period of cleaning.

Foreign substances holding on the surface of the flat porous plate 16a are constantly washed off by the processing solution vapor 302 or drips of the solution dropping from the semiconductor substrate wafer 200 and therefore the upper surface of the flat plate 16a is constantly kept clean without the rise of the foreign substances attaching on the semiconductor substrate wafer 200.

Furthermore, when the present embodiment is not used, foreign substances and mists rising from the cooler 14 can be prevented from contaminating the semiconductor substrate wafer 200 by providing a wider clearance between the semiconductor substrate wafer 200 and the cooler 14. In this case, however, a larger-sized apparatus will become necessary. According to the present embodiment, the use of the flat porous plate 16a provides a narrow clearance between the semiconductor substrate wafer 200 and the cooler 14, enabling the adoption of a small-sized apparatus.

Figure 28A:
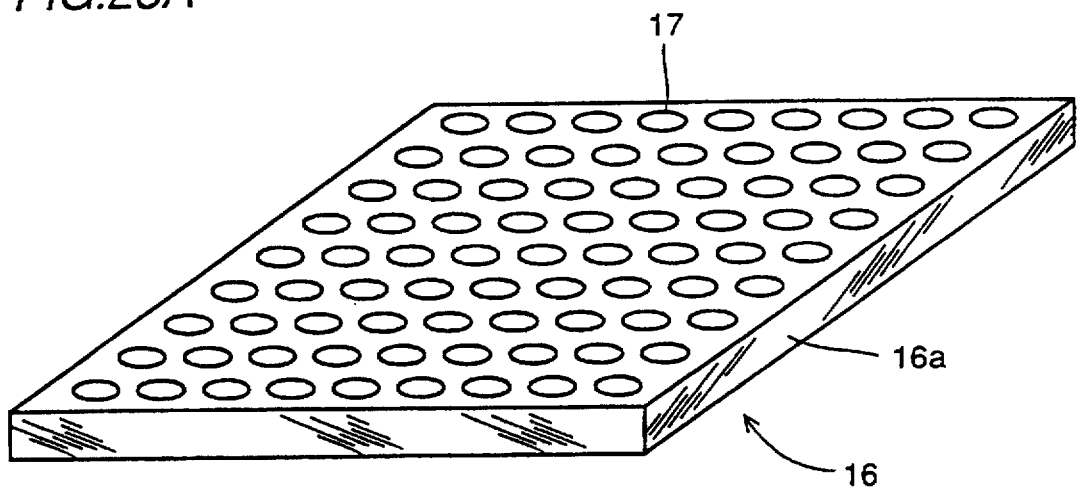
FIGS. 28A and 28B are a perspective view (a) and a plan view (b) of the means for preventing a rise of vapor.
Figure 28B:
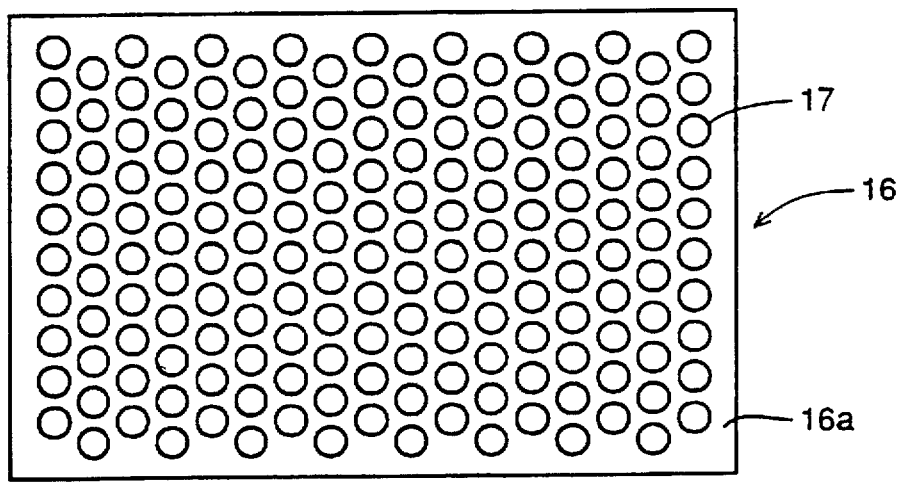
Figure 29A:
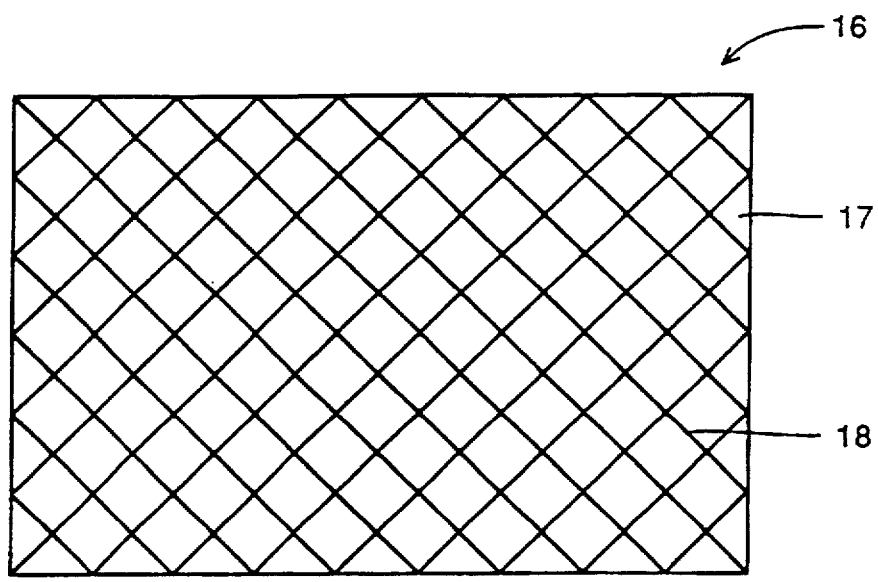
FIGS. 29A and 29B are a plan view (a) of another embodiment of the means for preventing a rise of vapor and a plan view (b) of another embodiment of the same.
Figure 29B:
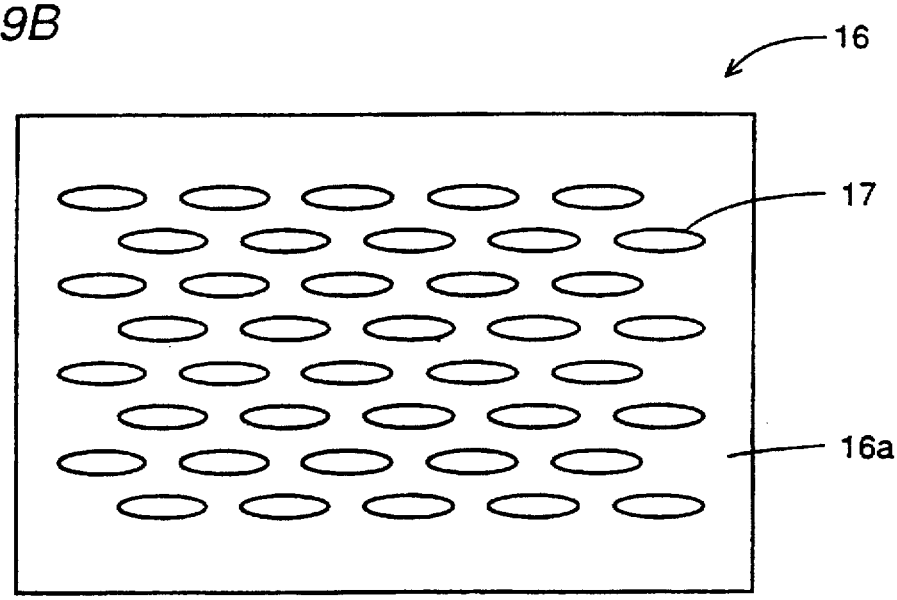
Figure 30:
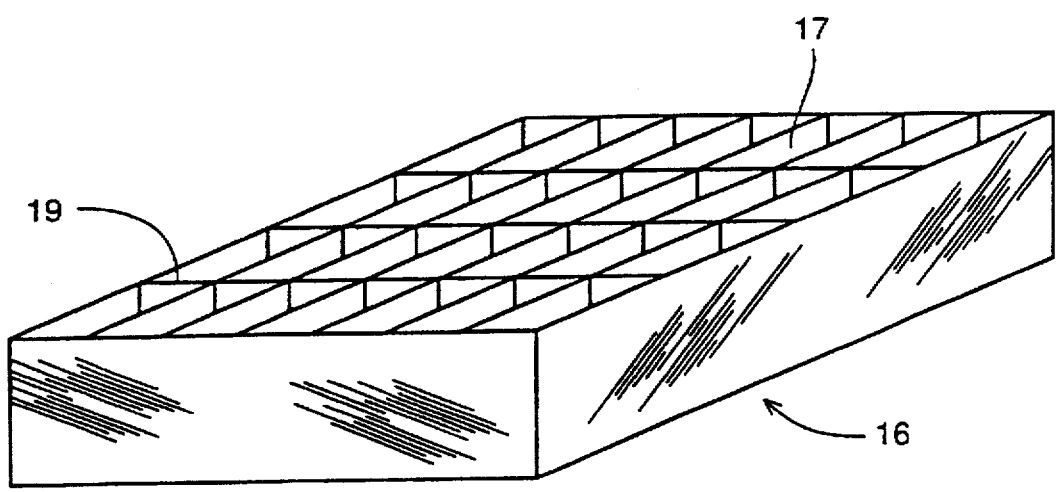
FIG. 30 is a perspective view of another embodiment of the means for preventing a rise of vapor.

FIGS. 28A and 28B are a perspective view (A) and a plan view (B) of the flat porous plate 16a which is a vapor rise preventing means 16. As shown in these drawings, the flat plate 16a is provided with a multitude of round holes 17, the diameter of which is preferably 0.5 mm to 1 mm. A spacing between the holes 17 is preferred to be 0.5 mm to 1 mm. The holes 17 are provided through the flat plate 16a from the upper surface to the lower surface. The vapor rise preventing means 16, as shown in FIG. 29 (A), may be constituted of a metal screen formed of a mesh wire 18 which has openings 17, and furthermore may be constituted of the flat plate 16a having oval holes 17 as shown in FIG. 29 (B). And furthermore the vapor rise preventing means 16 may be formed by assembling holes 17 and plates 19 as shown in FIG. 30.

Embodiment 22

Figure 31:
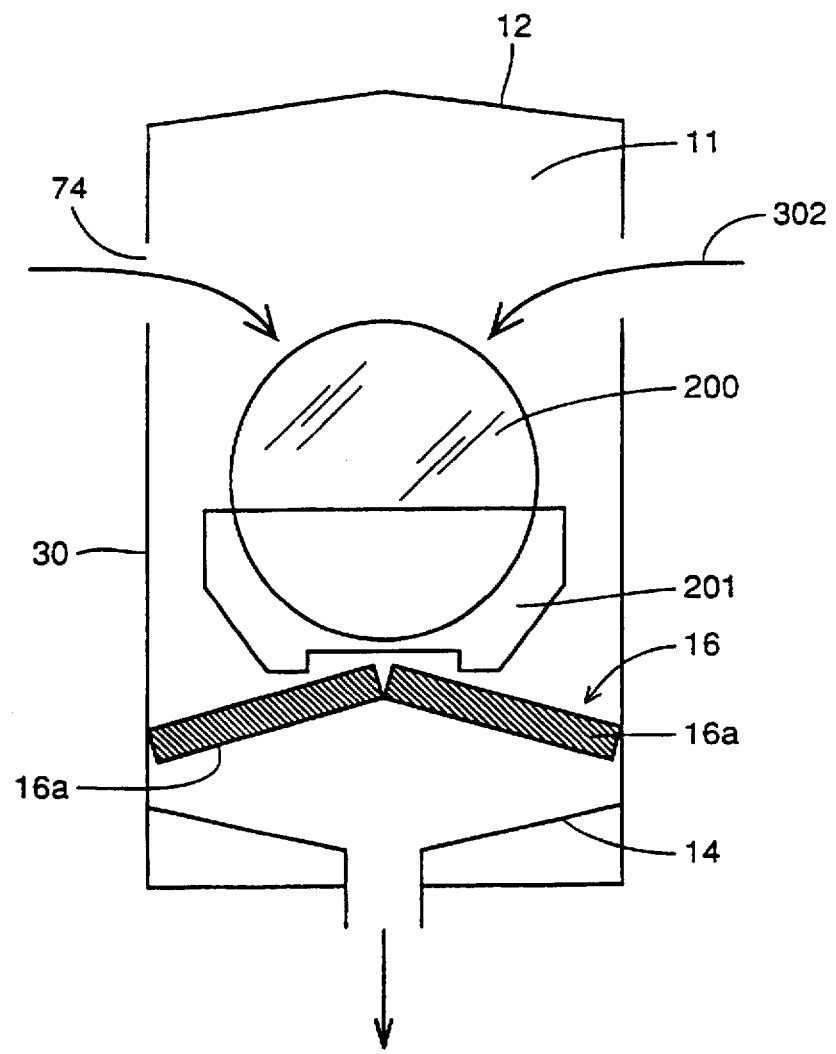
FIG. 31 is a schematic view of the steam drying apparatus pertaining to the embodiment 22.

FIG. 31 is a schematic view of the steam drying apparatus pertaining to the embodiment 22.

In the present embodiment, the flat porous plate 16a is bent with its central portion protruding upwards as shown in FIG. 31. By constituting the vapor rise preventing means 16 as described above, drips of the solution falling from the semiconductor substrate wafer 200 run along the oblique surface of the flat plate 16a, flowing along the inner surface of the side wall 30 of the process chamber 11 down to the surface of the cooler 14, consequently gaining a higher effect of cleaning to remove foreign substances from the surface of the flat plate 16a as compared with the apparatus described in the embodiment 1.

Embodiment 23

Figure 32:
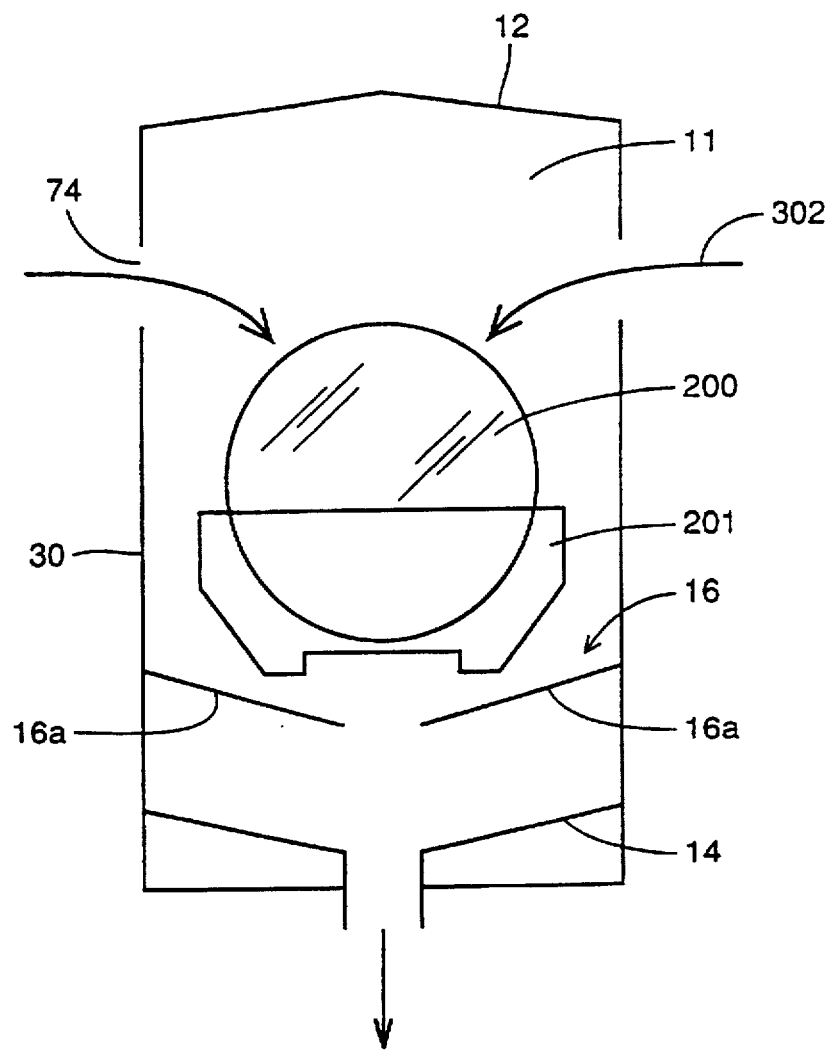
FIG. 32 is a schematic view of the steam drying apparatus pertaining to the embodiment 23.

FIG. 32 is a schematic view of the steam drying apparatus pertaining to the embodiment 23.

In the present embodiment, the vapor rise preventing means 16 is formed of two flat plates 16a removed from each other. The two flat plates 16a extends from the inner wall surface of the side wall 30 of the process chamber 11 with its forward end so arranged as to go downwards as it goes towards the center of the process chamber 11.

Figure 33:
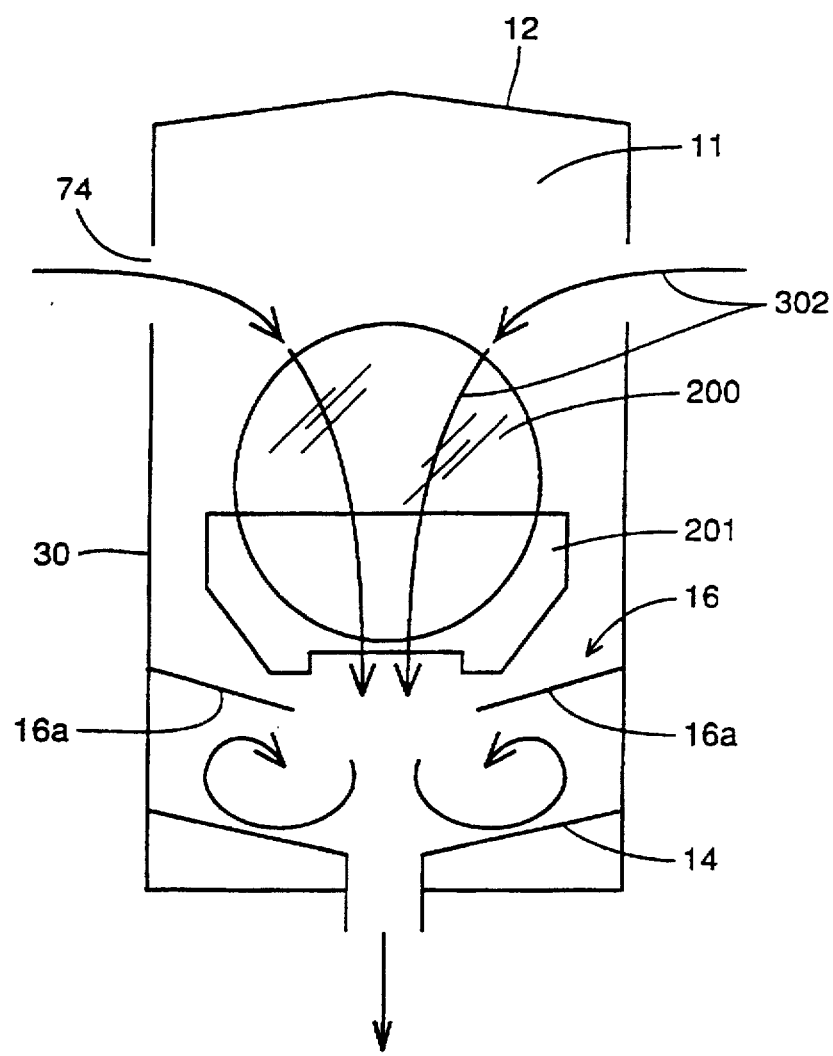
FIG. 33 is an explanatory view of operation of the steam drying apparatus pertaining to the embodiment 23.

Next, operation will be explained by referring to FIG. 33. The processing solution vapor 302 that has hit against the cooler 14 is checked from rising by the flat plate 16a. As a result, foreign matters present on the cooler 14 will not rise to stick on the semiconductor substrate wafer 200. Because the processing solution vapor 302 constantly flows downwards on the surface of the semiconductor substrate wafer 200, the processing solution that has condensed on the surface of the semiconductor substrate wafer 200 also constantly flows downwards. Consequently, the wet component and foreign substances present on the surface of the semiconductor substrate wafer 200 are removed efficiently.

Figure 34:
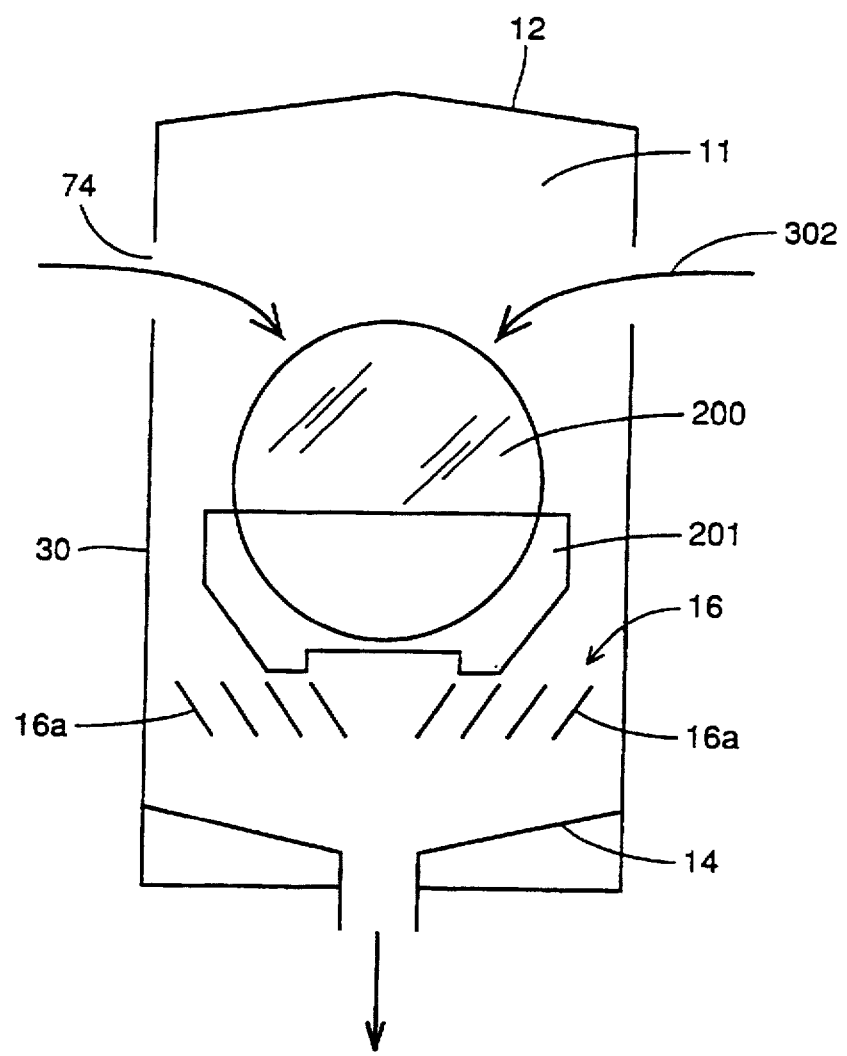
FIG. 34 is a schematic view of the steam drying apparatus pertaining to another embodiment of the embodiment 23.

In FIG. 34, a plurality of flat porous plates 16a are removed from one another to form the vapor rise preventing means 16. This type of embodiment also can display an effect similar to that of the apparatus shown in FIG. 33.

Embodiment 24

Figure 35:
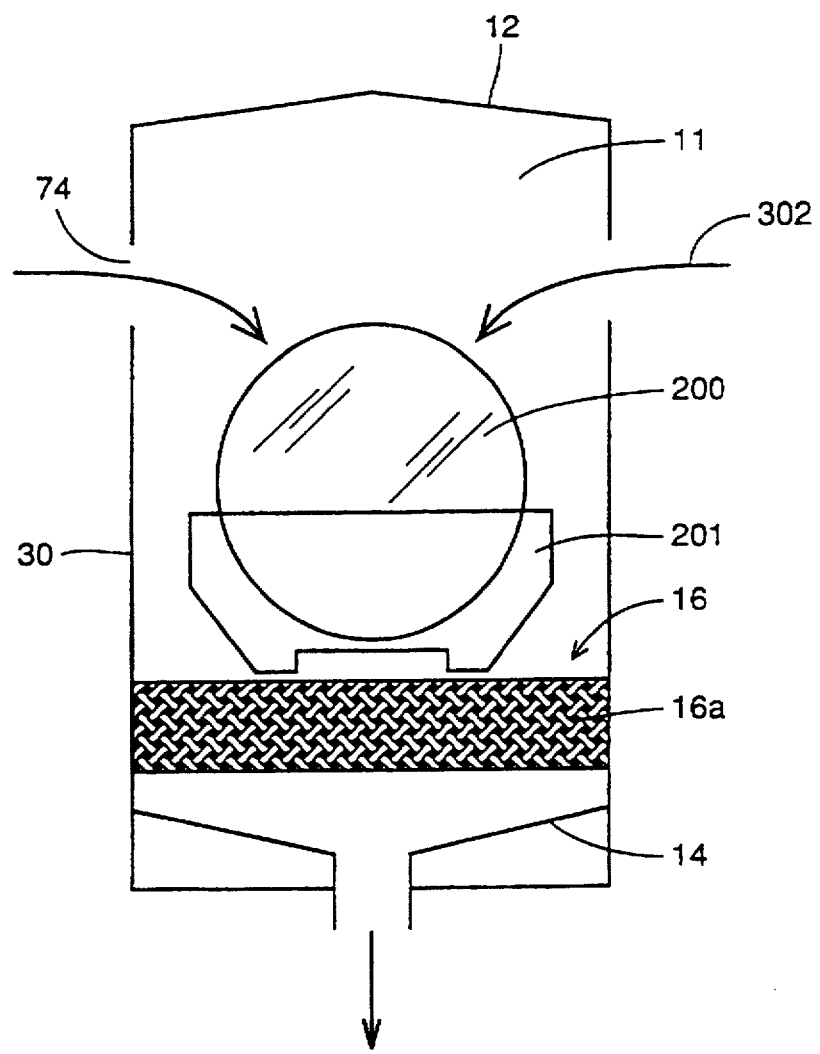
FIG. 35 is a schematic view of the steam drying apparatus pertaining to the embodiment 24.

FIG. 35 is a schematic view of the steam drying apparatus pertaining to the embodiment 24. According to this embodiment, the vapor rise preventing means 16 is formed of a metallic fiber 16a. By thus forming the vapor rise preventing means of the metallic fiber 16a, a trapping efficiency is increased, thereby enabling to prevent the rise of finer foreign substances. The foreign substances and mists rising from the surface of the cooler 14 are trapped by the metallic fiber 16a when passing through the metallic fiber 16a. The metallic fiber 16a has a narrow gap as compared with the porous plate used in the embodiment 1, and furthermore because of a complicatedly intertwined fiber the foreign substances and mists can be trapped more efficiently as compared with the porous plate.

Embodiment 25

Figure 36A:
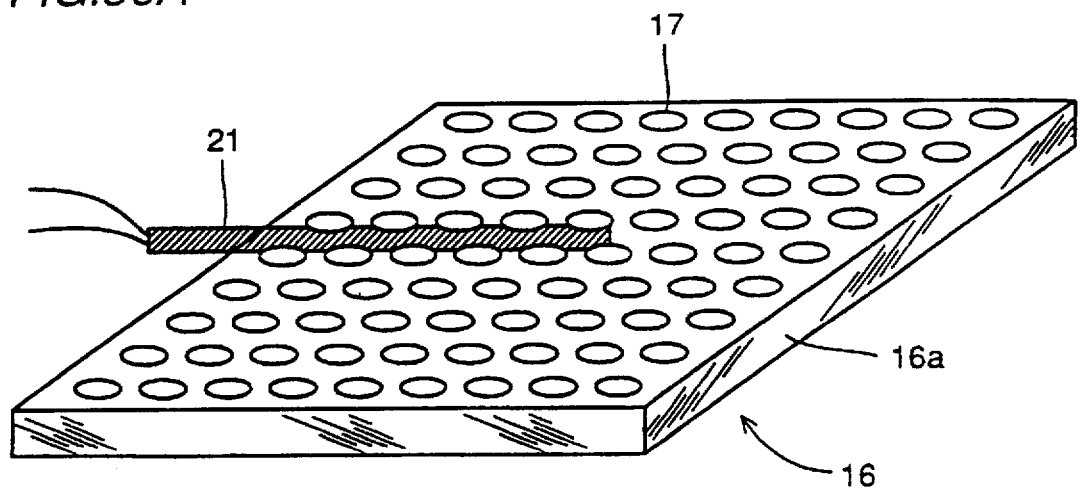
FIGS. 36A and 36B are a perspective view (A) and a plan view (B) of the means for preventing the rise of vapor in use in the steam drying apparatus pertaining to the embodiment 25.
Figure 36B:
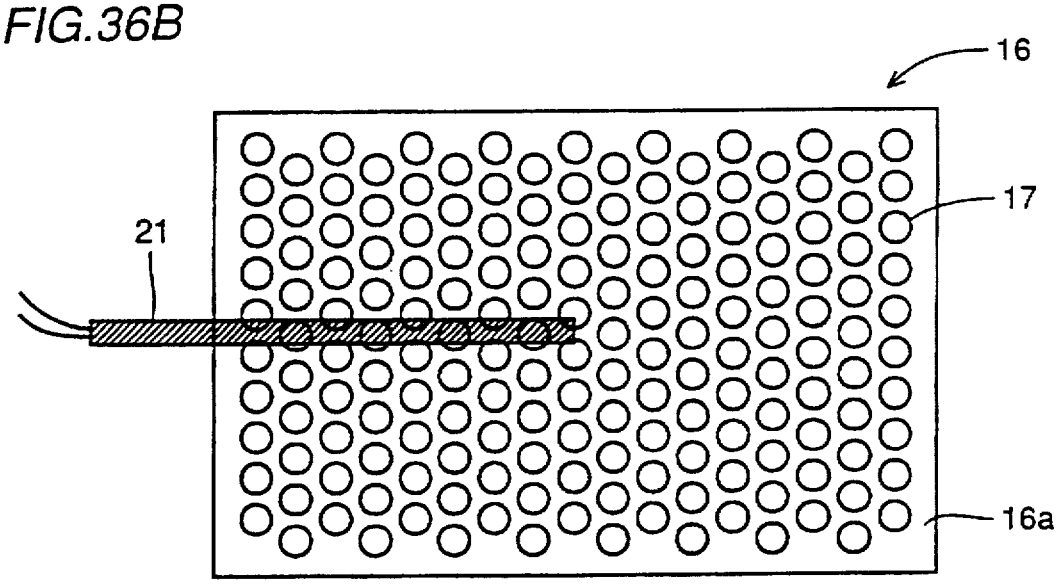

In FIGS. 36A and 36B is illustrated the vapor rise preventing means 16 of the apparatus according to the embodiment 25. FIG. 36 (A) is a perspective view and FIG. 36 (B) is a plan view. In these drawings, the heater 21 is embedded in the flat porous plate 16a. The flat plate 16a is formed of a thermal conduction type member. In FIG. 27, the processing solution vapor 302 that has been supplied at the steam supply port 74 into the process chamber 11 directly hits against the cooler 14, whereby mists are generated in the vapor by supercooling. The vapor rise preventing means shown in FIGS. 36A and 36B has been contrived to prevent this mists generation. The temperature of the flat plate 16a can be kept high by heating the flat plate 16a by the heater 21, thus preventing the mists generation likely to be caused by supercooling.

Embodiment 26

Figure 37A:
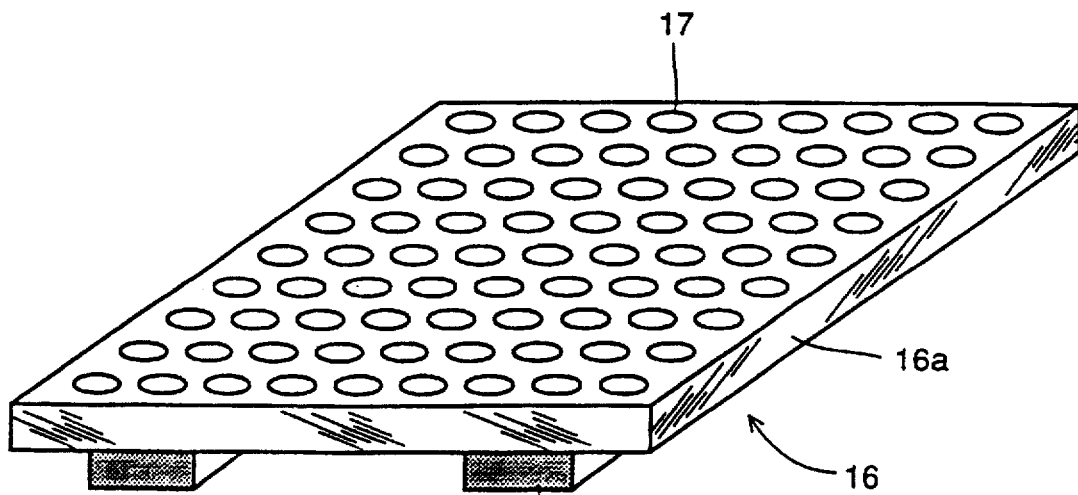
FIGS. 37A and 37B are a perspective view (A) and a plan view (B) of the means for preventing the rise of vapor in use in the steam drying apparatus pertaining to the embodiment 26.
Figure 37B:
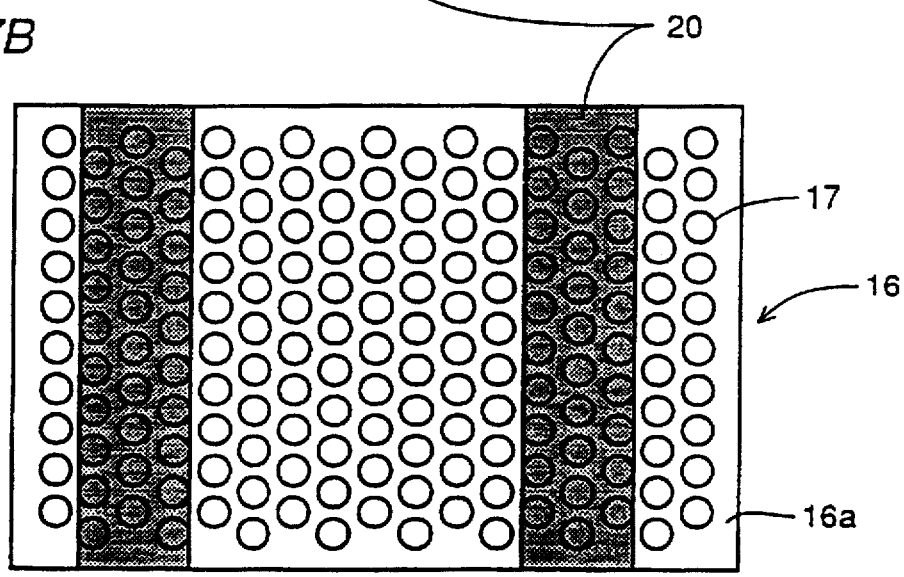

FIGS. 37A and 37B concerns another embodiment of the vapor rise preventing means. FIG. 37A is a perspective view and FIG. 37B is a plan view, both showing the vapor rise preventing means. In these drawings, a member, for example a metal 20, for accelerating thermal conduction is mounted on one side of the flat plate 16a. The flat plate 16a is attached on the side wall (being heated) of the process chamber. However, the flat plate 16a, having a multitude of holes 17, has an extremely little thermal conductivity. Therefore, heat from the side wall surface of the process chamber will not fully pass to the whole body of the flat plate 16a. In the present embodiment, as the metal plate 20 is fitted on the flat plate 16a, thermal conduction is promoted by this metal plate 20, allowing full heat transmission from the side wall of the process chamber to the whole part of the flat plate 16a. Using this metal plate 20, therefore, dispenses with the provision of the heater 21 as shown in FIGS. 36A and 36B. Also, the use of the vapor rise preventing means 16 shown in FIG. 37 (A) and (B) is able to keep the flat plate 16 at a higher temperature than the cooler 14; therefore, unlike the case (see FIG. 27) that the processing solution vapor 302 hits directly against the cooler 14, mist generation by supercooling can be prevented. Consequently the semiconductor substrate wafer 200 will not be contaminated.

Embodiment 27

Figure 38:
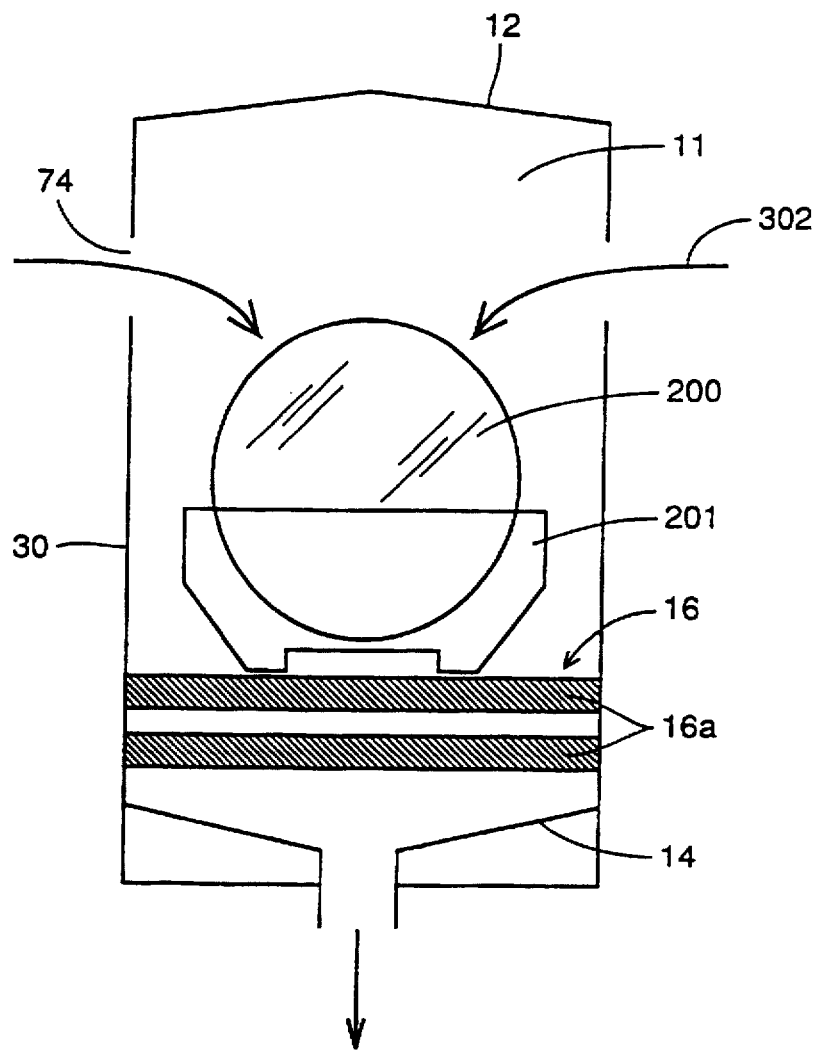
FIG. 38 is a schematic view of the steam drying apparatus pertaining to the embodiment 27.

FIG. 38 is a schematic view of the steam drying apparatus pertaining to the embodiment 27. In the present embodiment, flat porous plates 16a arranged vertically are separated from one another. Where only a single flat plate 16a is used, the temperature on one side of the cooler 14 of the flat plate 16a is lower than that on the other side of the semiconductor substrate wafer 200 because of radiation or convection of heat. In the prior art apparatus the heat passes in the direction of thickness of the flat plate 16a, lowering the temperature on the other side of the flat plate 16a on the semiconductor substrate wafer 200 side. The present embodiment has been developed to prevent this. That is, at least two flat porous plates 16 are vertically disposed to enable to restrain heat conduction in the direction of thickness of the flat plates 16a. As a result, the temperature on the other side of the flat plate 16a on the semiconductor substrate wafer 200 side can be raised higher than that in the case of the single flat plate 16a.

Furthermore, the provision of two flat plates 16a can efficiently prevent the flow of mists and foreign substances from the cooler 14 towards the semiconductor substrate wafer 200.

According to the steam drying apparatus in the first aspect of the present invention, since the steam supply port is provided in the second surface bent to face the inner wall surface of the lid, the processing solution vapor that has entered the process chamber at the steam supply port flows along the inner wall surface of the lid and is forced to flow downwards from above the material to be processed. In consequence, the stream of the processing solution vapor flows downwards on the surface of the material to be dried, ensuring downward advance of condensation. Therefore there is very little probability that foreign substances remain on the surface of a material after drying.

According to the cleaning apparatus in the second aspect of the present invention, since the steam drying apparatus having the above-described features is incorporated in the drying process, it is possible not only to prevent remaining of foreign substances and deposition of impurities on the surface of the dried material but to adjust semiconductor substrate loading positions to the same level in the steam drying apparatus, the chemical tank and the water washing tank; the semiconductor substrate, therefore, can be carried by the transfer robot.

According to the steam drying process in the third aspect of the present invention, the stream of the processing solution vapor is forced to flow downwards and therefore condensation advances downwards from above the surface of the material to be dried, thereby reducing the probability of remaining of foreign substances on the surface of the material to be dried. Furthermore, since the processing solution vapor is reduced to liquid and recovered, the consumption of the processing solution can be decreased.

According to the steam drying apparatus in the fourth aspect of the present invention, provided between the supporting means and the cooling means is the vapor rise preventing means for preventing the processing solution vapor that has hit against the cooling means from rising from the cooling surface towards the wafer, and consequently the semiconductor substrate wafer will never be contaminated.

What is claimed is:

1. A steam drying process for drying a material to be dried, by exposing said material to a processing solution vapor, comprising the steps of:

loading said material to be dried in a process chamber through an opening in an upper end thereof, said process chamber comprising a lid for hermetically closing said opening from above;

drying said material to be dried, by flowing said processing solution vapor upwardly hitting against said lid and then flowing downwardly from above said material to be dried; and condensing, beneath said material to be dried, to recover said processing solution vapor that has come into said process chamber.

2. The steam drying process according to claim 1, further comprising a step for refining a recovered condensate of said processing solution vapor and further evaporating said condensate for use as said processing solution vapor.

3. The steam drying process according to claim 1, wherein the interior of said process chamber is shut off from the outside air during the drying of the material to be dried.

4. The steam drying process according to claim 1, further comprising the step of feeding an inactive gas into said process chamber as required.

5. The steam drying process according to claim 1, wherein the said lid comprises a central part and two internal downwardly extending surfaces, which process comprises flowing the processing solution vapor along an inner surface of said lid hitting against the central part and then flowing downwardly to said material to be dried.

* * * * *

UNITED STATES PATENT AND TRADEMARK OFFICE
CERTIFICATE OF CORRECTION

PATENT NO.   : 5,709,037
DATED        : January 20, 1998
INVENTOR(S)  : Hiroshi Tanaka, et. al.

It is certified that error appears in the above-indentified patent and that said Letters Patent is hereby corrected as shown below:

Title page, item [54] and col. 1, line 1 should read --STEAM DRYING PROCESS --.

Signed and Sealed this

Twenty-eighth Day of July, 1998

Attest:

BRUCE LEHMAN

Attesting Officer

Commissioner of Patents and Trademarks